(12) United States Patent
Kwon

(10) Patent No.: US 11,545,422 B2
(45) Date of Patent: Jan. 3, 2023

(54) FAN-OUT SEMICONDUCTOR PACKAGE INCLUDING UNDER-BUMP METALLURGY

(71) Applicant: Samsung Electronics Co., Ltd., Suwon-si (KR)

(72) Inventor: Yonghwan Kwon, Yongin-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 1 day.

(21) Appl. No.: 17/225,178

(22) Filed: Apr. 8, 2021

(65) Prior Publication Data

US 2022/0102256 A1 Mar. 31, 2022

(30) Foreign Application Priority Data

Sep. 25, 2020 (KR) .................. 10-2020-0124619

(51) Int. Cl.
*H01L 23/48* (2006.01)
*H01L 23/498* (2006.01)
*H01L 23/538* (2006.01)
*H01L 25/18* (2006.01)
*H01L 23/00* (2006.01)

(52) U.S. Cl.
CPC .. *H01L 23/49816* (2013.01); *H01L 23/49822* (2013.01); *H01L 23/49833* (2013.01); *H01L 23/49838* (2013.01); *H01L 23/5385* (2013.01); *H01L 23/5386* (2013.01); *H01L 24/05* (2013.01); *H01L 24/16* (2013.01); *H01L 25/18* (2013.01); *H01L 2224/16146* (2013.01); *H01L 2224/16147* (2013.01); *H01L 2224/16227* (2013.01); *H01L 2224/16235* (2013.01); *H01L 2924/1431* (2013.01); *H01L 2924/1436* (2013.01)

(58) Field of Classification Search
None
See application file for complete search history.

(56) References Cited

U.S. PATENT DOCUMENTS

| 7,534,652 | B2 | 5/2009 | Haba et al. |
| 9,196,586 | B2 | 11/2015 | Chen et al. |
| 9,257,333 | B2 | 2/2016 | Lu et al. |
| 9,548,240 | B2 | 1/2017 | Lin et al. |
| 10,204,889 | B2 | 2/2019 | Lin et al. |
| 10,431,559 | B2 | 10/2019 | Lin |
| 10,622,320 | B2 | 4/2020 | Kim et al. |
| 10,665,473 | B2 | 5/2020 | Lin et al. |

(Continued)

*Primary Examiner* — Hung K Vu
(74) *Attorney, Agent, or Firm* — Muir Patent Law, PLLC

(57) ABSTRACT

A fan-out semiconductor package includes: a support wiring structure including a support wiring conductive structure, a plurality of support wiring insulating layers including a first support wiring insulating layer having a recess area and a second support wiring insulating layer on the first support wiring insulating layer and enveloping the support wiring conductive structure, a pad layer enveloped by the second support wiring insulating layer and connected to the support wiring conductive structure, and an under-bump metallurgy (UBM) layer enveloped by the first support wiring insulating layer and connected to the pad layer; and a semiconductor chip on the support wiring structure, wherein the UBM layer includes a body portion and a protrusion protruding from the body portion and arranged in the recess area.

20 Claims, 36 Drawing Sheets

(56) References Cited

U.S. PATENT DOCUMENTS

| | | |
|---|---|---|
| 10,665,535 B2 | 5/2020 | Lee et al. |
| 2019/0131225 A1* | 5/2019 | Jeong .................. H01L 21/4853 |
| 2019/0139784 A1* | 5/2019 | Lin .................. H01L 23/49838 |
| 2019/0348386 A1* | 11/2019 | Huang .................. H01L 21/565 |

* cited by examiner

FAN-OUT SEMICONDUCTOR PACKAGE INCLUDING UNDER-BUMP METALLURGY

CROSS-REFERENCE TO RELATED APPLICATION

This application is based on and claims priority under 35 U.S.C. § 119 to Korean Patent Application No. 10-2020-0124619, filed on Sep. 25, 2020, in the Korean Intellectual Property Office, the disclosure of which is incorporated by reference herein in its entirety.

BACKGROUND

The inventive concept relates to a semiconductor package, and more particularly, to a fan-out semiconductor package including an under-bump metallurgy (UBM) layer.

Due to the significant progress in the electronics industry and the demand of users, electronic devices are becoming more and more compact and multi-functional and have greater capacity, thus requiring a highly integrated semiconductor chip.

Accordingly, a semiconductor package having connection terminals, with which connection reliability is ensured, is designed for highly integrated semiconductor chips in which the number of connection terminals for input/output (I/O) is increased; for example, to prevent interference among connection terminals, a fan-out semiconductor package in which a distance between the connection terminals is increased is being developed.

SUMMARY

The inventive concept provides a fan-out semiconductor package including an under-bump metallurgy (UBM) layer whereby the connection reliability of connection terminals may be increased.

According to an aspect of the inventive concept, there is provided a fan-out semiconductor package as below.

The fan-out semiconductor package includes: a support wiring structure including a support wiring conductive structure, a plurality of support wiring insulating layers including a first support wiring insulating layer having a recess area and a second support wiring insulating layer on the first support wiring insulating layer, the plurality of support wiring insulating layers enveloping the support wiring conductive structure, a pad layer enveloped by the second support wiring insulating layer and connected to the support wiring conductive structure, and an under-bump metallurgy (UBM) layer enveloped by the first support wiring insulating layer and connected to the pad layer; and a semiconductor chip on the support wiring structure, wherein the UBM layer includes a body portion and a protrusion protruding from the body portion and arranged in the recess area.

A fan-out semiconductor package includes: a support wiring structure including: a support wiring conductive structure; a plurality of support wiring insulating layers including a first support wiring insulating layer having a recess area and a second support wiring insulating layer on the first support wiring insulating layer, the plurality of support wiring insulating layers enveloping the support wiring conductive structure; a pad layer enveloped by the second support wiring insulating layer and connected to the support wiring conductive structure; an under-bump metallurgy (UBM) layer including a body portion enveloped by the first support wiring insulating layer and connected to the pad layer and at least one protrusion protruding from the body portion and not externally protruding from a lower surface of the first support wiring insulating layer in the recess area and arranged apart from the first support wiring insulating layer and surrounded by a connection terminal arranged on the body portion, wherein the UBM layer is integrally formed with the pad layer; and a barrier conductive layer arranged to extend from between a lower surface of the pad layer and the first support wiring insulating layer to between a side surface of the body portion and the first support wiring insulating layer; and a semiconductor chip arranged on the support wiring structure and having a horizontal width and a horizontal area that are less than a horizontal width and a horizontal area of the support wiring structure.

A fan-out semiconductor package includes: a redistribution interposer including: a support wiring conductive structure; a plurality of support wiring insulating layers including a first support wiring insulating layer having a recess area and a second support wiring insulating layer on the first support wiring insulating layer, the plurality of support wiring insulating layers enveloping the support wiring conductive structure; a pad layer enveloped by the second support wiring insulating layer and connected to the support wiring conductive structure; an under-bump metallurgy (UBM) layer including a body portion enveloped by the first support wiring insulating layer and connected to the pad layer and at least one protrusion protruding from the body portion and not externally protruding from a lower surface of the first support wiring insulating layer in the recess area and arranged apart from the first support wiring insulating layer, wherein the UBM layer is integrally formed with the pad layer; and a barrier conductive layer extending from between a lower surface of the pad layer and the first support wiring insulating layer to between a side surface of the body portion and the first support wiring insulating layer and arranged not to cover a surface of the at least one protrusion; and a first semiconductor chip and a second semiconductor chip that are apart from each other on the redistribution interposer in a horizontal direction to be electrically connected to the support wiring conductive structure, wherein the first semiconductor chip includes a first sub-semiconductor chip and a plurality of second sub-semiconductor chips that are stacked in a vertical direction; a molding layer surrounding the first semiconductor chip and the second semiconductor chip on the redistribution interposer; a connection terminal surrounding the at least one protrusion on the body portion of the UBM layer and having a portion arranged in the recess area; and a main board on which the redistribution interposer is mounted to be connected to the connection terminal.

BRIEF DESCRIPTION OF THE DRAWINGS

Embodiments of the inventive concept will be more clearly understood from the following detailed description taken in conjunction with the accompanying drawings in which like numeral refer to like elements throughout. In the drawings.

DETAILED DESCRIPTION OF THE EMBODIMENTS

Figure 1:
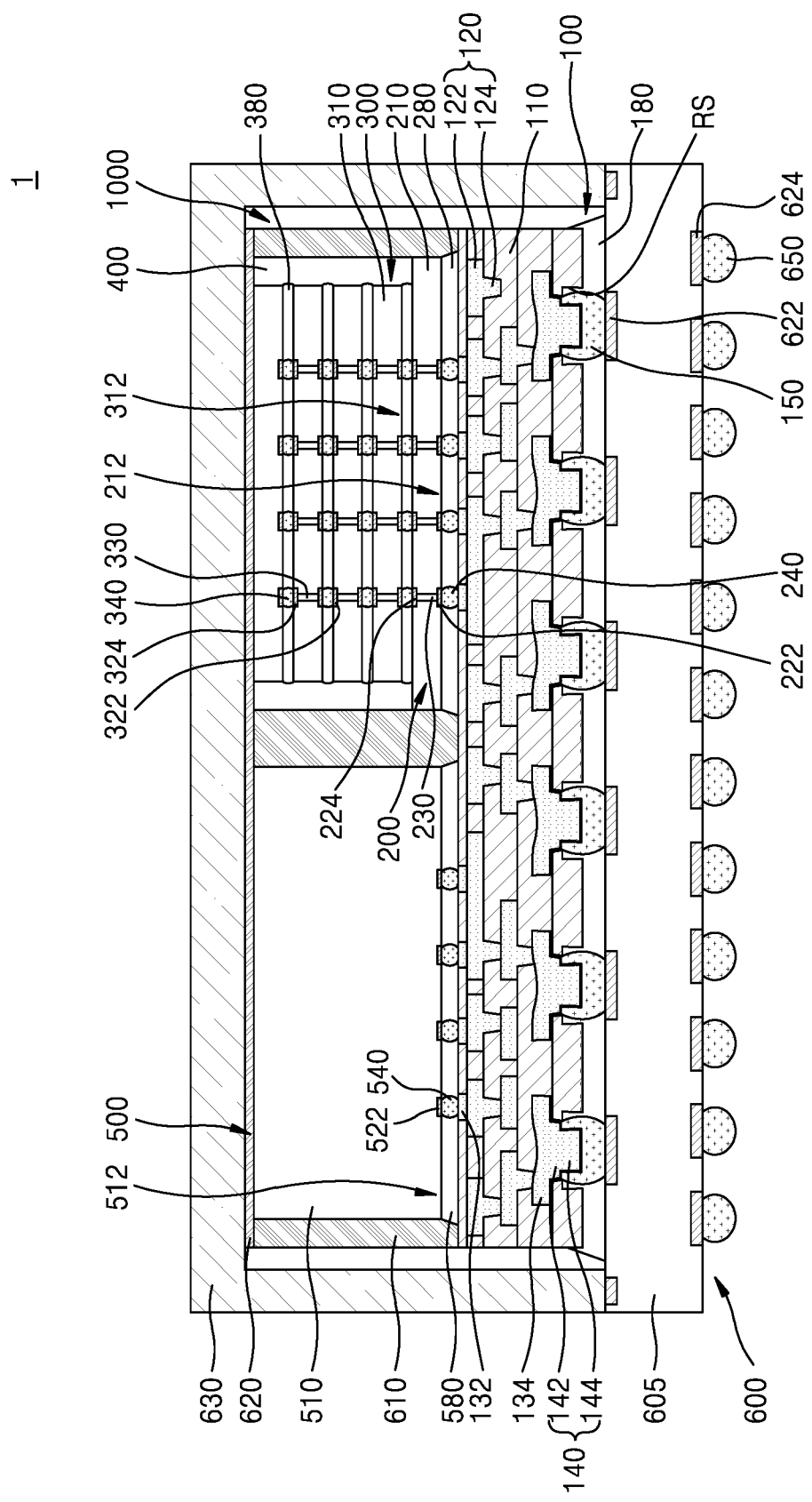
FIG. 1 is a cross-sectional view of a fan-out semiconductor package, according to example embodiments.

FIG. 1 is a cross-sectional view of a fan-out semiconductor package according to example embodiments.

Referring to FIG. 1, a fan-out semiconductor package 1 may include a main board 600 on which a support wiring structure 100 is mounted, and at least one first semiconductor chip 1000 and a second semiconductor chip 500 that are attached to the support wiring structure 100. The at least one first semiconductor chip 1000 and the second semiconductor chip 500 may be mounted on the support wiring structure 100 and may be apart from each other in a horizontal direction.

The at least one first semiconductor chip 1000 and the second semiconductor chip 500 may be respectively electrically connected to a support wiring conductive structure 120 of the support wiring structure 100 via a plurality of first connection terminals 240 and a plurality of second connection terminals 540. For example, the at least one first semiconductor chip 1000 may be electrically connected to the support wiring structure 120 via the plurality of first connection terminals 240, and the second semiconductor chip 500 may be electrically connected to the support wiring structure 120 via the plurality of second connection terminals 540. The at least one first semiconductor chip 1000 may have a plurality of first upper surface connection pads 222, and the second semiconductor chip 500 may have a plurality of second upper surface connection pads 522. The plurality of first upper surface connection pads 222 may be in contact with the plurality of first connection terminals 240, and the plurality of second upper surface connection pads 522 may be in contact with the plurality of second connection terminals 540. As used herein, the term "contact" refers to a direction connection (i.e., touching) unless the context indicates otherwise.

The support wiring structure 100 may include a support wiring insulating layer 110 and the support wiring conductive structure 120. The support wiring insulating layer 110 may envelop the support wiring conductive structure 120. For example, the support wiring structure 100 may include a redistribution interposer including a redistribution layer.

In some embodiments, the support wiring structure 100 may include a plurality of support wiring insulating layers 110 that are stacked. A support wiring insulating layer 110 at a lowermost end from among the plurality of support wiring insulating layers 110 may have a recess area RS. The support wiring insulating layers 110 may be formed of, for example, a photo imageable dielectric (PID) or photosensitive polyimide (PSPI). The support wiring conductive structure 120 may include a metal such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), or an alloy thereof, but is not limited thereto. In some embodiments, the support wiring conductive structure 120 may be formed by stacking copper or a copper alloy on a barrier conductive layer including titanium, titanium nitride, or titanium tungsten.

The support wiring conductive structure 120 may include a plurality of support wiring line patterns 122 arranged at least on one of an upper surface and a lower surface of the support wiring insulating layer 110 and a plurality of support wiring vias 124 that pass through the support wiring insulating layer 110 to respectively contact and be connected to some of the plurality of support wiring patterns 122. In some embodiments, at least some of the support wiring line patterns 122 may be formed with some of the plurality of support wiring vias 124 to be integral therewith. For example, a support wiring line pattern 122 and a support wiring via 124 that is in contact with a lower surface of the support wiring line pattern 122 may be integrally formed. In some embodiments, an upper surface of a portion of the support wiring line pattern 122 contacting the support wiring via 124 may have a relatively concave shape in comparison with other portions thereof. As used herein, the term "integral" may refer to structures, patterns, and/or layers that are formed at the same time and of the same material, without a break in the continuity of the material of which they are formed. As one example, structures, patterns, and/or layers that are formed to be "integral" may be homogeneous monolithic structures.

In some embodiments, each of the plurality of support wiring vias 124 may have a tapered shape in which a horizontal width thereof narrows downwards. For example, a horizontal width of each of the plurality of support wiring vias 124 may narrow away from the at least one first semiconductor chip 1000 and the second semiconductor chip 500.

A plurality of upper surface pads 132 and a plurality of lower surface pads 134 may be arranged on an upper surface and a lower surface of the support wiring structure 100, respectively. The support wiring conductive structure 120 may electrically connect the plurality of upper surface pads 132 to the plurality of lower surface pads 134. In some embodiments, the support wiring conductive structure 120 may electrically connect some of the plurality of upper surface pads 132 to some other ones of the upper surface pads 132.

In some embodiments, the plurality of upper surface pads 132 may include a same material as the support wiring conductive structure 120. In some embodiments, each of the plurality of upper surface pads 132 may be formed by stacking copper or a copper alloy on a seed layer including titanium, titanium nitride, or titanium tungsten. In some embodiments, an upper surface pad 132 may be stacked on the support wiring line pattern 122 at an uppermost end. In other embodiments, an upper surface pad 132 may be a portion of the support wiring line pattern 122 at an uppermost end.

A plurality of under-bump metallurgy (UBM) layers 140 may be respectively arranged on the plurality of lower surface pads 134. A UBM layer 140 may be arranged on a lower surface of each of the plurality of lower surface pads 134. In some embodiments, the plurality of lower surface pads 134 and the plurality of UBM layers 140 may include a same material as the support wiring conductive structure 120. In some embodiments, each of the plurality of upper surface pads 134 and each of the plurality of UBM layers 140 may be formed by stacking copper or a copper alloy on a seed layer including titanium, titanium nitride, or titanium tungsten. Each of the plurality of UBM layers 140 may include a body portion 142 and a protrusion 144 protruding from the body portion 142.

A single lower surface pad 134 and a single UBM layer 140 arranged on a lower surface of a single lower surface pad 134 may be integrally formed in a single body. A support wiring insulating layer 110 at a lowermost end from among the stacked support wiring insulating layers 110 included in the support wiring structure 100 may envelop the UBM layer 140, and a support wiring insulating layer 110 at a next end to the lowermost end may envelop the lower surface pad 134. A portion of an upper surface and a side surface of the lower surface pad 134 may be covered by the support wiring insulating layer 110. A side surface of the body portion 142 of the UBM layer 140 may be by the support wiring insulating layer 110, and the support wiring insulating layer 110 may contact the side surface of the body portion 142 of the UBM layer 140. The protrusion 144 may be arranged in the recess area RS of the support wiring insulating layer 110 to be apart from the support wiring insulating layer 110 without contacting the same. The protrusion 144 may not externally protrude from a lower surface of the support wiring insulating layer 110. For example, a lower surface of the protrusion 144 may be at a higher level than the lower surface of the support wiring insulating layer 110. The lower surface pad 134 and the UBM layer 140 will be described in detail with reference to FIGS. 2A through 3B and 4A through 5E.

The plurality of first connection terminals 240 may be arranged between some of the plurality of upper surface pads 132 of the support wiring structure 100 and the plurality of first upper surface connection pads 222 of the at least one first semiconductor chip 1000 to electrically connect the support wiring structure 100 to the at least one first semiconductor chip 1000. The plurality of second connection terminals 540 may be arranged between some other ones of the plurality of upper surface pads 132 of the support wiring structure 100 and the plurality of second upper surface connection pads 522 to electrically connect the support wiring structure 100 to the second semiconductor chip 500.

In some embodiments, the plurality of first connection terminals 240 and the plurality of second connection terminals 540 may be each a solder ball or a bump. For example, the plurality of first connection terminals 240 and the plurality of second connection terminals 540 may each include a conductive pillar and a conductive cap on the conductive pillar. The conductive pillar may include copper, nickel, stainless steel, or a copper alloy such as beryllium copper. The conductive cap may include silver (Ag), tin (Sn), gold (Au), or a solder. For example, the conductive cap may include SnAg.

The first semiconductor chip 1000 includes a first sub-semiconductor chip 200 and a plurality of second sub-semiconductor chips 300. While the first semiconductor chip 1000 is illustrated in FIG. 1 as including four second sub-semiconductor chips 300, the inventive concept is not limited thereto. For example, the first semiconductor chip 1000 may include at least two second sub-semiconductor chips 300. In some embodiments, the first semiconductor chip 1000 may include second sub-semiconductor chips 300 corresponding to a multiple of four. The plurality of second sub-semiconductor chips 300 may be sequentially stacked on the first sub-semiconductor chip 200 in a vertical direction. The first sub-semiconductor chip 200 and each of the plurality of second sub-semiconductor chips 300 may be sequentially stacked with their active surfaces facing downwards.

The first sub-semiconductor chip 200 includes a first semiconductor substrate 210 having an active surface on which a first semiconductor element 212 is formed, a first upper surface connection pad 222 and a first lower surface connection pad 224 that are respectively formed on the active surface and an inactive surface of the first semiconductor substrate 210, and a first through electrode 230 that passes through at least a portion of the first semiconductor substrate 210 to electrically connect the first upper surface connection pad 222 to the first lower surface connection pad 224.

The first semiconductor substrate 210 may include, for example, a semiconductor material such as silicon (Si). Alternatively, the first semiconductor substrate 210 may include a semiconductor element such as germanium (Ge), or a compound semiconductor such as silicon carbide (SiC), gallium arsenide (GaAs), indium arsenide (InAs), and indium phosphide (InP). The first semiconductor substrate 210 may include a conductive region, for example, an impurity-doped well. The first semiconductor substrate 210 may include various device isolation structures such as a shallow trench isolation (STI).

In the present specification, an upper surface and a lower surface of a semiconductor substrate such as the first semiconductor substrate 210 refer to an active surface side and an inactive surface side of the semiconductor substrate, respectively. For example, when an active surface of a semiconductor substrate is located below an inactive surface thereof in a final product, in the present specification, the active surface side of the semiconductor substrate may be referred to as an upper surface of the semiconductor substrate, and the inactive surface side of the semiconductor substrate may be referred to as a lower surface of the semiconductor substrate. Also, the terms 'upper surface' and 'lower surface' may be used for components arranged on an active surface of a semiconductor substrate and components arranged on an inactive surface thereof.

The first semiconductor element 212 including various types of multiple individual devices may be formed on the active surface of the first semiconductor substrate 210. The multiple individual devices may include various microelectronic devices, such as a metal-oxide-semiconductor field effect transistor (MOSFET), for example, a complementary metal-insulator-semiconductor transistor (CMOS transistor), a system large scale integration (LSI), an image sensor such as a CMOS imaging sensor (CIS), a micro-electromechanical system (MEMS), an active element, a passive element, or the like. The multiple individual devices may be electrically connected to the conductive region of the first semiconductor substrate 210. The first semiconductor element 212 may further include a conductive wiring or a conductive plug that electrically connects at least two of the multiple individual devices or the multiple individual devices to the conductive region of the first semiconductor substrate 210. Also, the multiple individual devices may be each electrically isolated from other neighboring individual devices via an insulating layer.

In some embodiments, the first sub-semiconductor chip 200 may include a buffer chip including a serial-parallel conversion circuit. In some embodiments, the first sub-semiconductor chip 200 may be a buffer chip for control of a high bandwidth memory (HBM) dynamic random access memory (DRAM) semiconductor chip. When the first sub-semiconductor chip 200 is a buffer chip for controlling an HBM DRAM semiconductor chip, the first sub-semiconductor chip 200 may be referred to as a master chip, and the HBM DRAM semiconductor chip may be referred to as a slave chip.

The second sub-semiconductor chip 300 includes a second semiconductor substrate 310 having an active surface on which a second semiconductor element 312 is formed, a plurality of inner upper surface connection pads 322 and a plurality of inner lower surface connection pads 324 that are respectively arranged on the active surface and an inactive surface of the second semiconductor substrate 310, and a plurality of second through electrodes 330 that pass through at least a portion of the second semiconductor substrate 310 to electrically connect the plurality of inner upper surface connection pads 322 to the plurality of inner lower surface connection pads 324. The second semiconductor substrate 310, the inner upper surface connection pads 322, the inner lower surface connection pads 324, and the second through electrodes 330 are respectively identical to the first semiconductor substrate 210, the first upper surface connection pads 222, the first lower surface connection pads 224, and the first through electrode 230, and thus, detailed descriptions thereof will be omitted.

In some embodiments, the second sub-semiconductor chips 300 may be an HBM DRAM semiconductor chip. The first sub-semiconductor chip 200 may be referred to as a master chip, and the second sub-semiconductor chips 300 may be referred to as a slave chip.

A plurality of inner connection terminals 340 may be respectively attached to the plurality of inner upper surface connection pads 322 of the plurality of second sub-semiconductor chips 300. The inner connection terminals 340 may electrically connect the first lower surface connection pad 224 of the first sub-semiconductor chip 200 and the inner upper surface connection pads 322 of the second sub-semiconductor chip 300 that is at a lowermost end and arranged closest to the first sub-semiconductor chip 200 from among the plurality of second sub-semiconductor chips 300 and the inner lower surface connection pad 324 to the inner upper surface connection pad 322 among the plurality of second sub-semiconductor chips 300. In some embodiments, each of the plurality of inner connection terminals 340 may be a solder ball or a bump.

An insulating adhesive layer 380 may be between the first sub-semiconductor chip 200 and the adjacent one of the second sub-semiconductor chips 300, and between each of the plurality of the second sub-semiconductor chips 300. The insulating adhesive layer 380 may include a non-conductive film (NCF), a non-conductive paste (NCP), an insulating polymer, or an epoxy resin. The insulating adhesive layer 380 may surround the inner connection terminals 340 and fill spaces between the first sub-semiconductor chip 200 and each of the plurality of second sub-semiconductor chips 300.

In some embodiments, from among the plurality of second sub-semiconductor chips 300, the second sub-semiconductor chip 300 arranged farthest from the first sub-semiconductor chip 200 may not include the inner lower surface connection pad 324 and the second through electrode 330. In some embodiments, from among the plurality of second sub-semiconductor chips 300, a thickness of the second sub-semiconductor chip 300 arranged farthest from the first sub-semiconductor chip 200 may be greater than thicknesses of the other second sub-semiconductor chips 300. As used herein, thickness may refer to the thickness or height measured in a vertical direction.

A width and an area of the first sub-semiconductor chip 200 may be greater than a width and an area of each of the second sub-semiconductor chips 300. For example, when viewed in cross-section, a width in the horizontal direction of the first sub-semiconductor chip 200 may be greater than a width in the horizontal direction of each of the second sub-semiconductor chips 300. The first semiconductor chip 1000 may further include a first molding layer 400 that surrounds side surfaces of the plurality of second sub-semiconductor chips 300 and a side surface of the insulating adhesive layer 380 on the first sub-semiconductor chip 200. The first molding layer 400 may include, for example, an epoxy mold compound (EMC).

The second semiconductor chip 500 may include a third semiconductor substrate 510 having an active surface on which a third semiconductor element 512 is formed and a plurality of second upper surface connection pads 522 arranged on the active surface of the third semiconductor substrate 510. The plurality of second connection terminals 540 may be attached to the plurality of second upper surface connection pads 522. The third semiconductor substrate 510, the second upper surface connection pads 522, and the second connection terminals 540 are respectively and substantially the same as the first semiconductor substrate 210, the first upper surface connection pads 222, and the first connection terminals 140, and thus, detailed descriptions thereof will be omitted. As used herein, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise.

The second semiconductor chip 500 may be, for example, a central processing unit (CPU) chip, a graphics processing unit (GPU) chip, or an application processor (AP) chip.

A first underfill layer 280 may be between the first semiconductor chip 1000 and the support wiring structure 100, and a second underfill layer 580 may be between the second semiconductor chip 500 and the support wiring structure 100. The first underfill layer 280 and the second underfill layer 580 may respectively surround the first connection terminals 240 and the second connection terminals 540.

The fan-out semiconductor package 1 may further include a second molding layer 610 surrounding side surfaces of the first semiconductor chip 1000 and the second semiconductor chip 500 on the support wiring structure 100. The second molding layer 610 may include, for example, an EMC.

In some embodiments, the second molding layer 610 may cover the upper surface of the support wiring structure 100 and the side surfaces of the first semiconductor chip 1000 and the second semiconductor chip 500, but not upper surfaces of the first semiconductor chip 1000 and the second semiconductor chip 500. In this case, the fan-out semiconductor package 1 may further include a heat dissipation member 630 covering the upper surfaces of the first semiconductor chip 1000 and the second semiconductor chip 500. The heat dissipation member 630 may include a heat dissipation plate such as a heat slug or a heat sink. In some embodiments, the heat dissipation member 630 may envelop the first semiconductor chip 1000, the second semiconductor chip 500, and the support wiring structure 100 on an upper surface of the main board 600.

Also, the fan-out semiconductor package 1 may further include a thermal interface material (TIM) 620 arranged between the heat dissipation member 630 and the first semiconductor chip 1000 and the second semiconductor chip 500. The TIM 620 may include, for example, a paste or a film.

A plurality of connection terminals 150 may be respectively attached to the plurality of UBM layers 140. The plurality of connection terminals 150 may electrically connect the support wiring structure 100 to the main board 600. In some embodiments, the plurality of connection terminals 150 may be solder balls. The connection terminals 150 may respectively surround the protrusions 144 on the body portions 142. For example, each connection terminal 150 may surround and contact side and lower surfaces of a corresponding one of the protrusions 144. In some embodiments, each connection terminal 150 may contact a lower surface of a corresponding one of the body portions 142. A portion of the connection terminals 150 may be arranged in the recess area RS.

A board underfill layer 180 may be between the support wiring structure 100 and the main board 600. The board underfill layer 180 may surround the plurality of connection terminals 150.

The main board 600 may include a base board layer 605 and a plurality of board upper surface pads 622 and a plurality of board lower surface pads 624 that are respectively arranged on upper and lower surfaces of the base board layer 605. In some embodiments, the main board 600 may be a printed circuit board. For example, the main board 600 may be a multi-layer printed circuit board. The base board layer 605 may include at least one of a phenol resin, an epoxy resin, and polyimide.

A solder resist layer (not shown) exposing the plurality of board upper surface pads 622 and the plurality of board lower surface pads 624 may be formed both on the upper surface and the lower surface of the base board layer 605. The connection terminals 150 may be connected to the board upper surface pads 622, and a package connection terminal 650 may be connected to the board lower surface pads 624. The connection terminals 150 may electrically connect the lower surface pads 134 to the board upper surface pads 622. The package connection terminal 650 connected to the board lower surface pads 624 may connect the fan-out semiconductor package 1 to the outside.

In some embodiments, the heat dissipation member 630 may perform an electromagnetic wave shielding function, and may be connected to some of the plurality of board upper surface pads 622 of the main board 600, in which a ground connection is provided.

According to the fan-out semiconductor package 1 of the inventive concept, as the connection terminal 150 surrounds the protrusion 144 on the body portion 142 of the UBM layer 140, a bonding area between the connection terminal 150 and the UBM layer 140 is increased, thereby increasing connection reliability. Also, a portion of the connection terminal 150 is arranged in the recess area RS of the support wiring insulating layer 110, and thus, a portion of the support wiring insulating layer 110 defining the recess area RS may perform a dam function to prevent a solder which constitutes the connection terminal 150, from flowing to the surroundings during a process of forming the connection terminal 150.

Figure 2A:
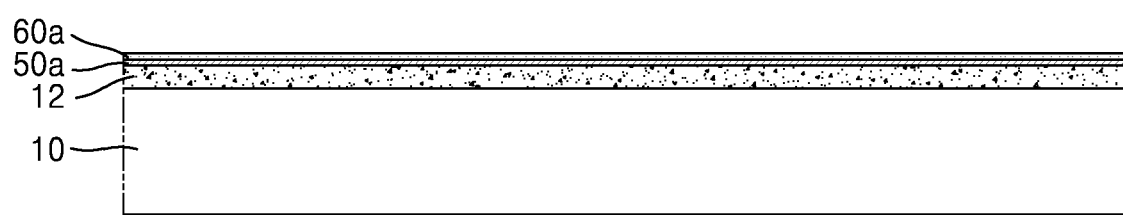
FIGS. 2A through 2N are cross-sectional views illustrating a method of manufacturing an under-bump metallurgy (UBM) layer, which is included in a fan-out semiconductor package, according to example embodiments and to which a connection terminal is attached.
Figure 2B:
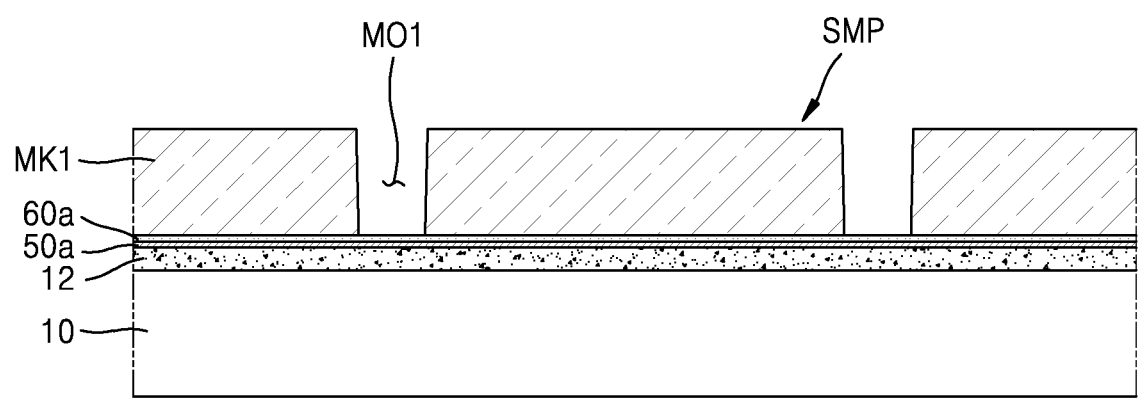
Figure 2C:
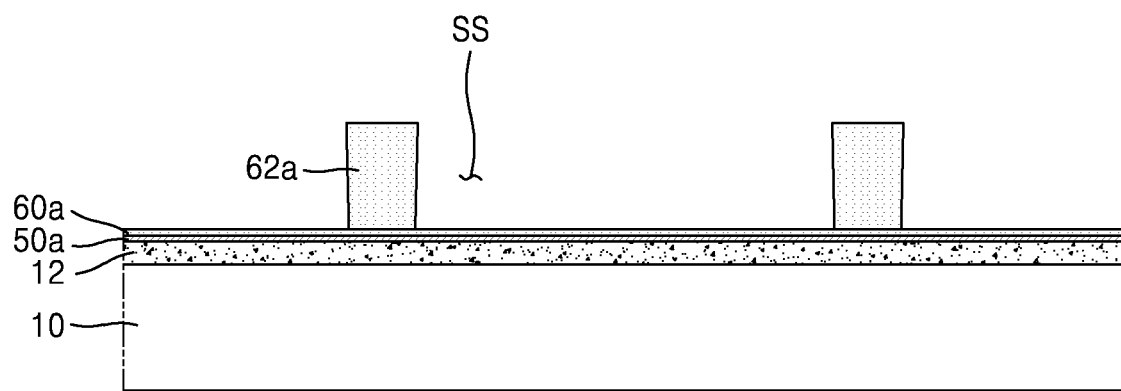
Figure 2D:
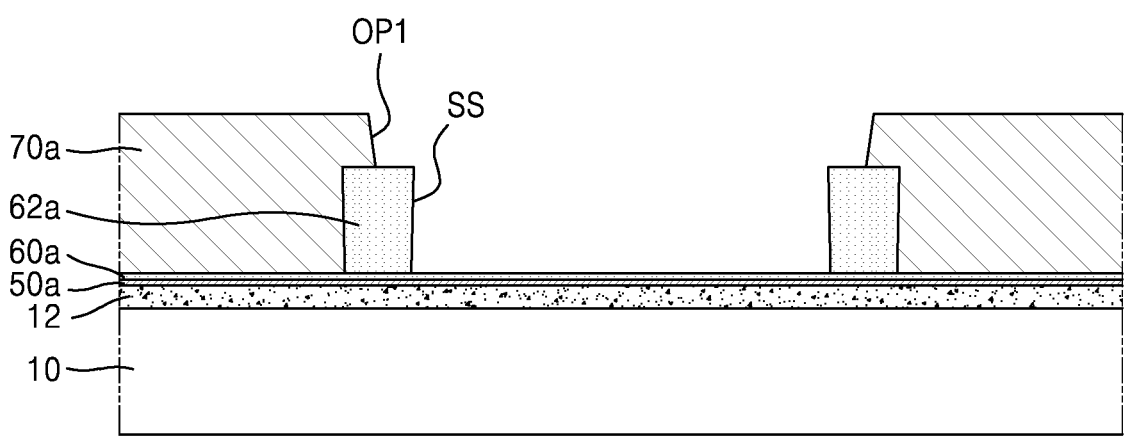
Figure 2E:
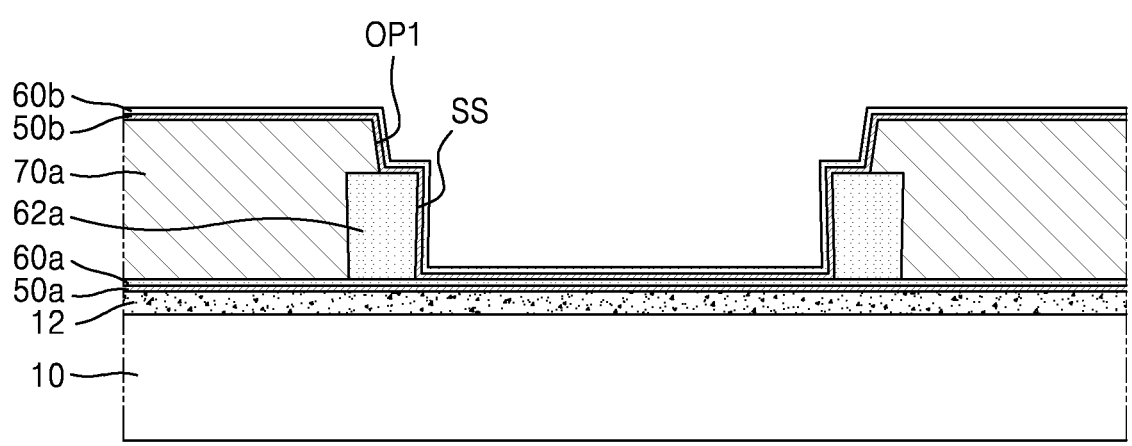
Figure 2F:
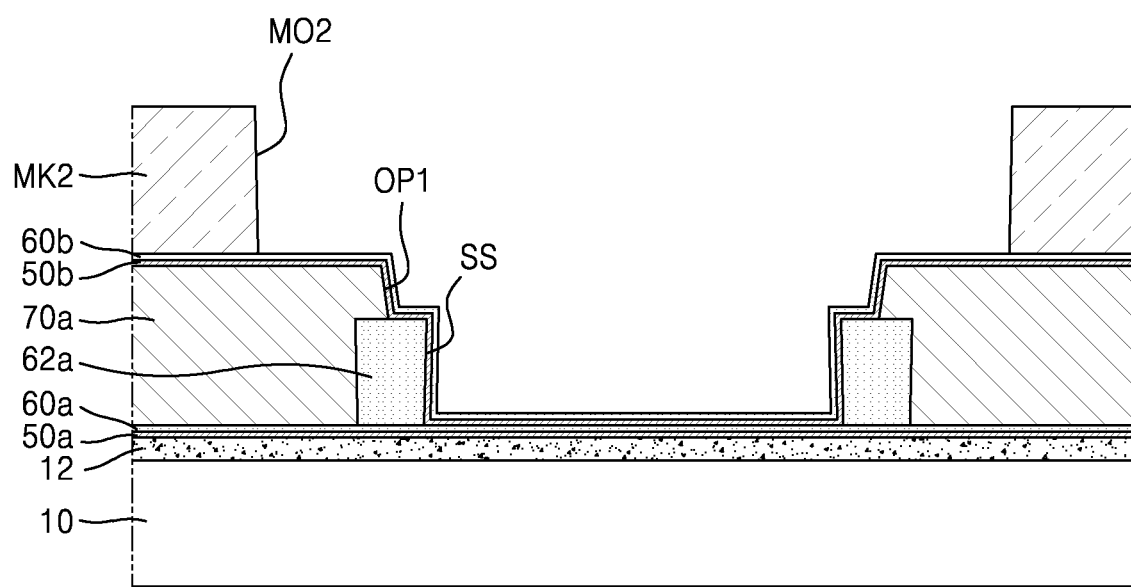
Figure 2G:
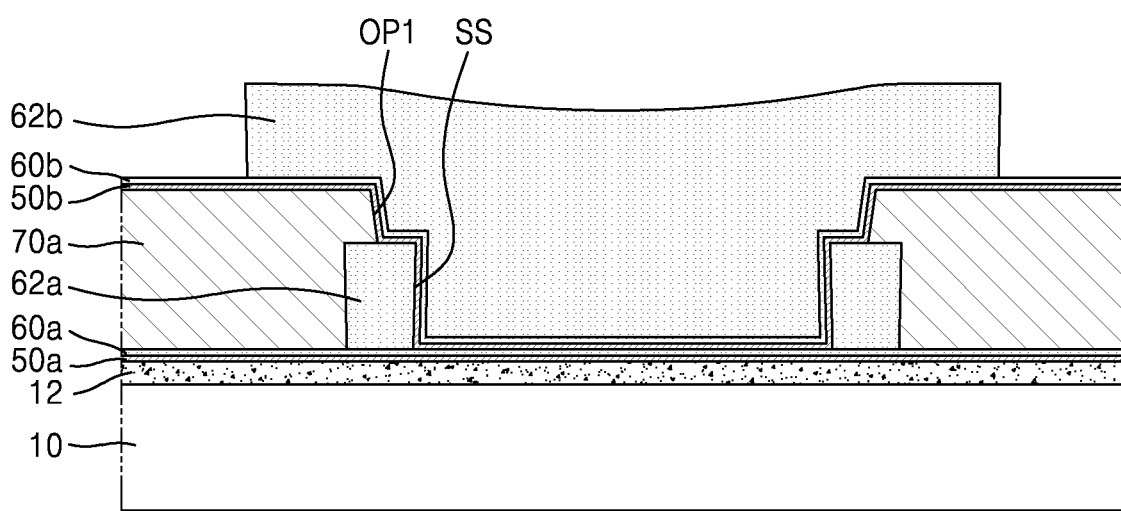
Figure 2H:
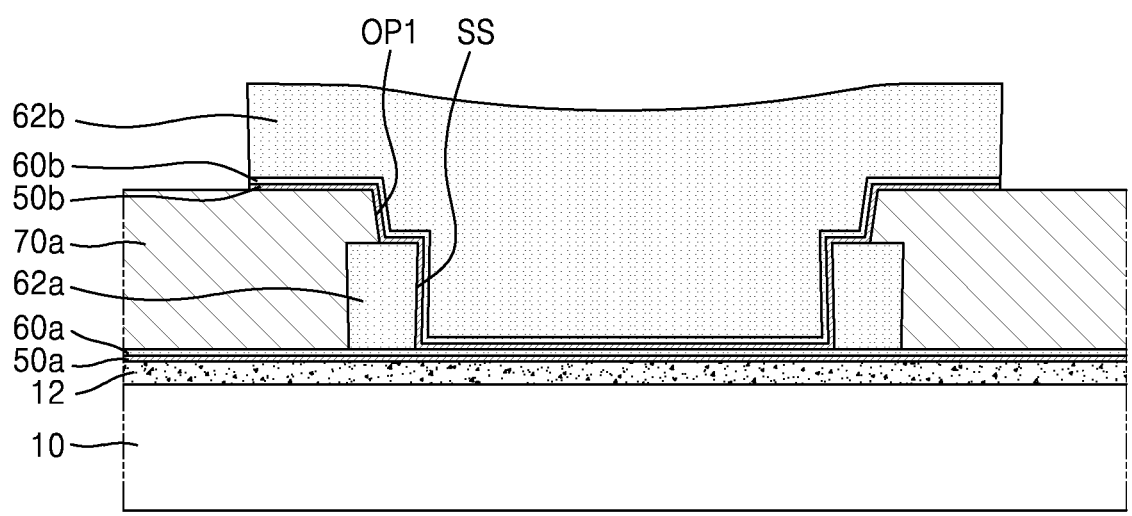
Figure 2I:
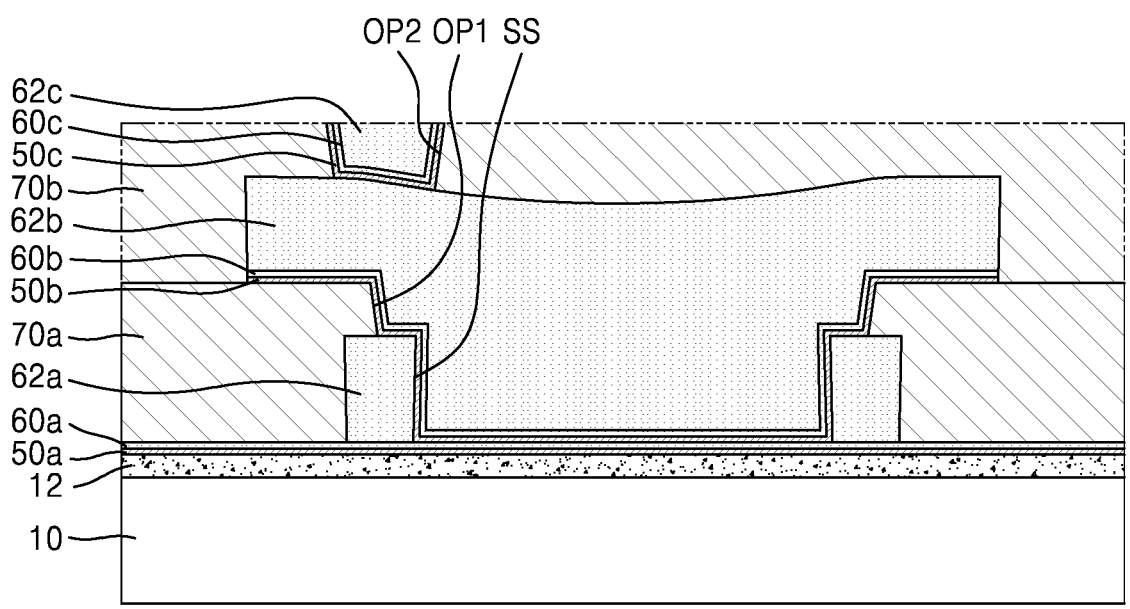
Figure 2J:
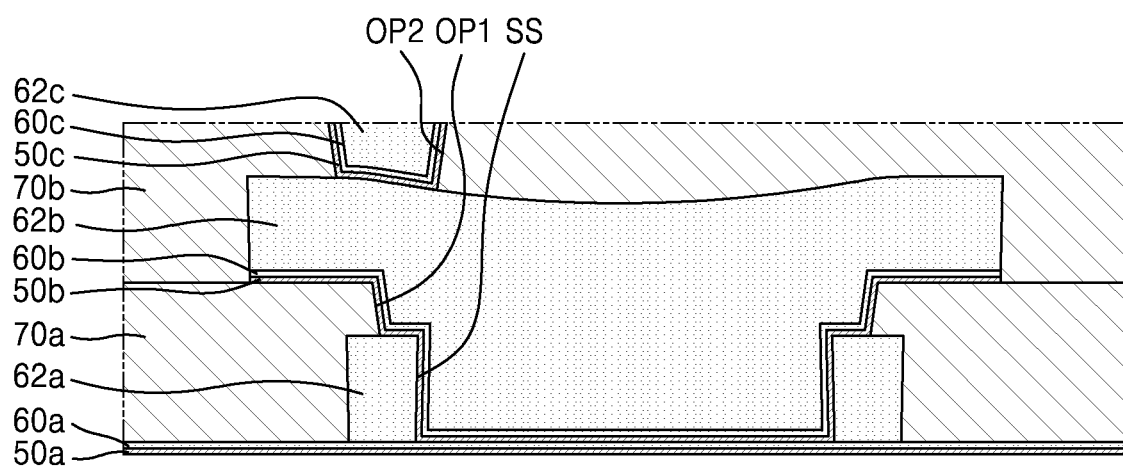
Figure 2K:
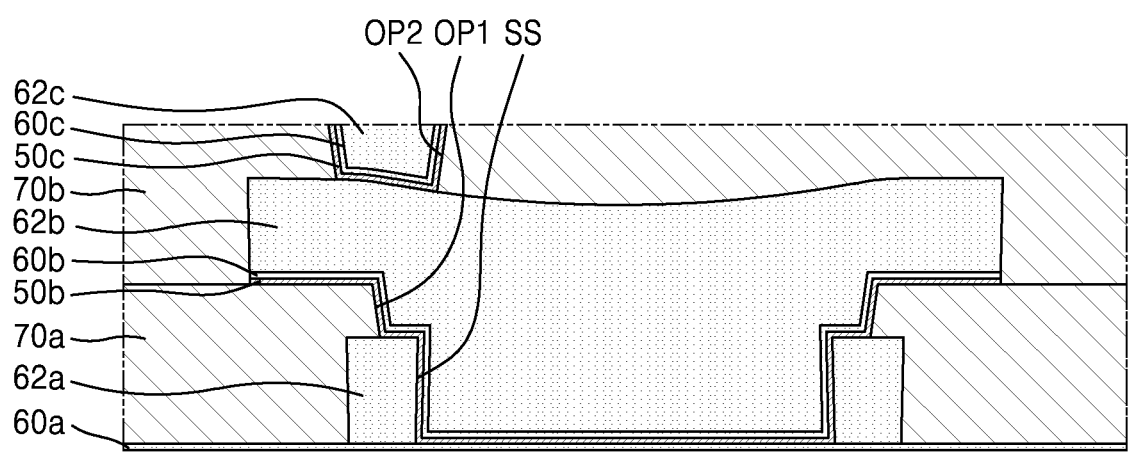
Figure 2L:
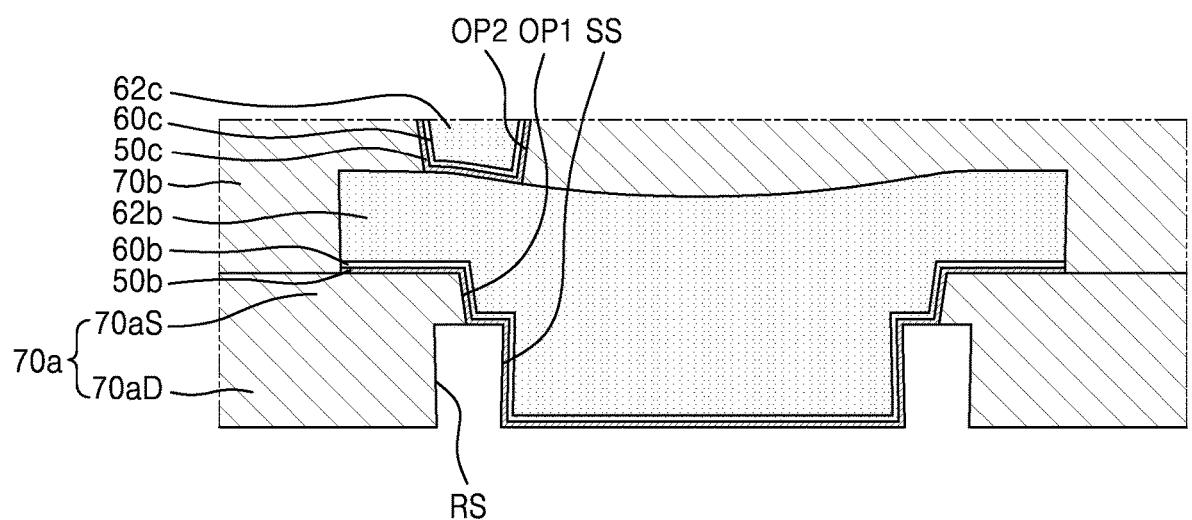
Figure 2M:
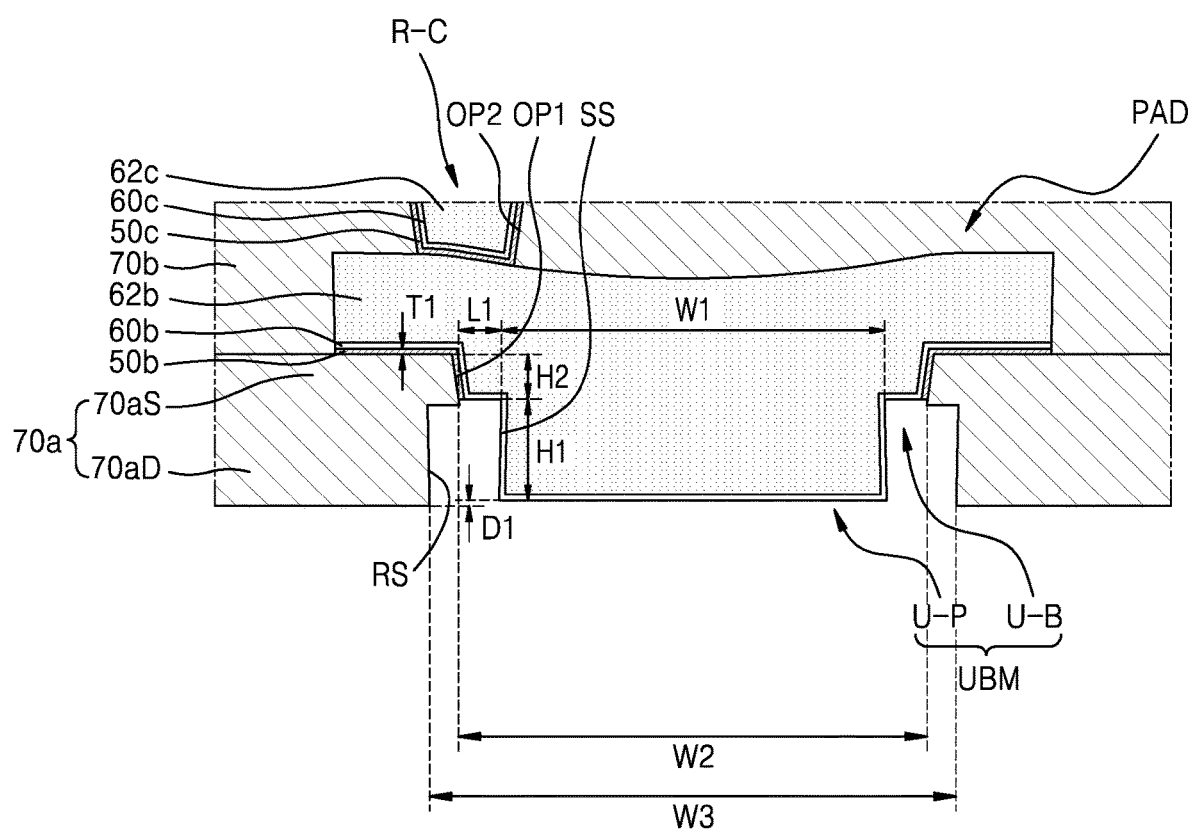
Figure 2N:
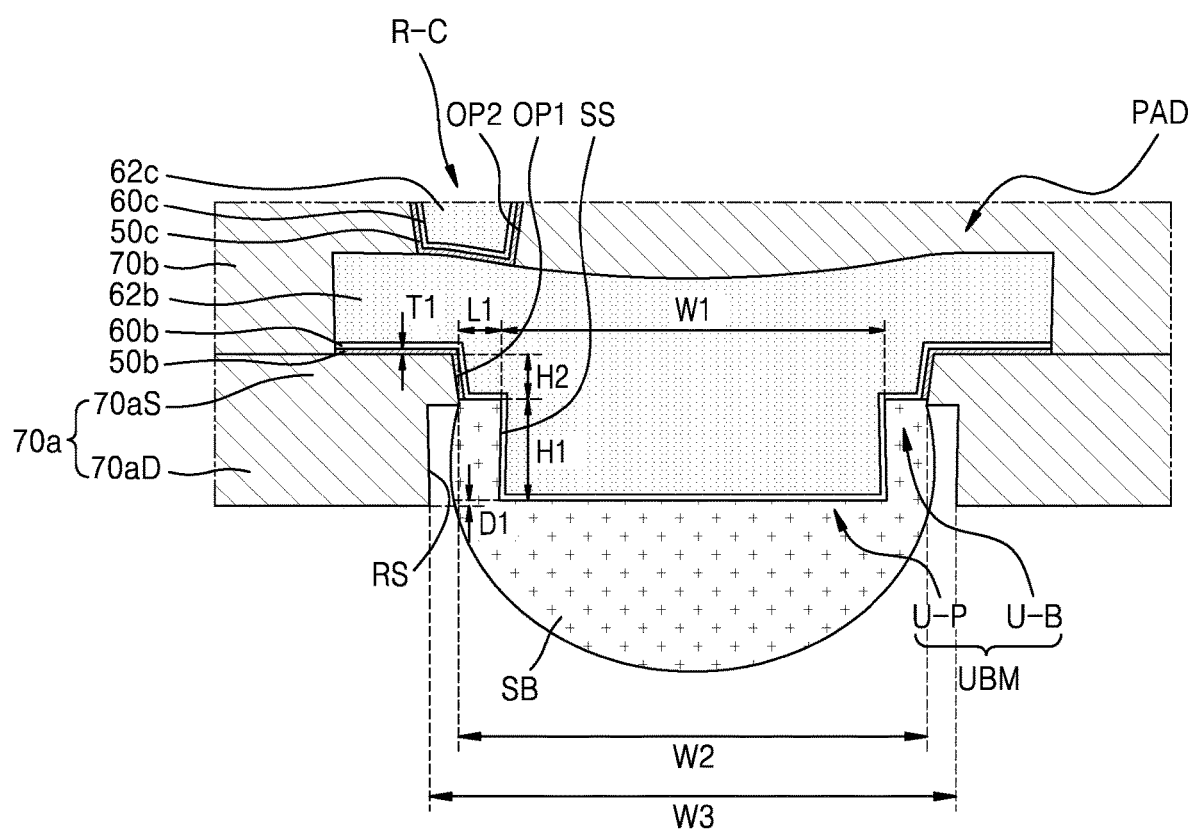

FIGS. 2A through 2N are cross-sectional views illustrating a method of manufacturing a UBM layer, which is included in a fan-out semiconductor package according to example embodiments and to which a connection terminal is attached.

Referring to FIG. 2A, a first barrier conductive layer 50a and a first seed layer 60a are sequentially formed on a release film 12 attached to a carrier substrate 10. The first barrier conductive layer 50a and the first seed layer 60a may be formed using a physical vapor deposition method such as a sputtering process.

The carrier substrate 10 may be, for example, a semiconductor substrate, a transmissive substrate, or a heat-resistant substrate. In some embodiments, the carrier substrate 10 may be a glass substrate. In other embodiments, the carrier substrate 10 may include a heat-resistant organic polymer material such as polyimide (PI), poly(etheretherketone) (PEEK), poly(ethersulfone) (PES), or poly(phenylene sulfide) (PPS).

The release film 12 may include a laser reactive layer or a thermal reactive layer that reacts to laser irradiation or heating to be gasified to thereby allow the carrier substrate 10 to be separated. For example, the release film 12 may include a single layer or a multi-layer structure including a release layer attached to each of two surfaces of a backbone layer. The backbone layer may include, for example, a thermoplastic polymer. The release layer may include, for example, a copolymer including acryl and silicone.

The first barrier conductive layer 50a and the first seed layer 60a may be each conformally formed to cover the carrier substrate 10, to which the release film 12 is attached, with an approximately uniform thickness. In some embodiments, the first barrier conductive layer 50a and the first seed layer 60a may each have a thickness of 1 μm or less. For example, the first barrier conductive layer 50a and the first seed layer 60a may each have a thickness of about 0.1 μm.

The first barrier conductive layer 50a may include a material having an etching selectivity with respect to the first seed layer 60a. The first barrier conductive layer 50a may include a metal such as titanium (Ti) or tantalum (Ta), or an alloy of the metal, or a conductive metal nitride. In some embodiments, the first barrier conductive layer 50a may include titanium, titanium nitride, or titanium tungsten. The first seed layer 60a may include a metal or a metal alloy. For example, the first seed layer 60a may include copper or a copper alloy.

Referring to FIG. 2B, a first mask pattern MK1 having a first mask opening MO1 may be formed on the first seed layer 60a. The first mask pattern MK1 may be formed of, for example, a photoresist. In some embodiments, the first mask opening MO1 may have a horizontal width of about 20 μm or greater.

The first mask pattern MK1 may have a side surface that is perpendicular or near-perpendicular to an upper surface of the first seed layer 60a in the first mask opening MO1. For example, an acute angle between the upper surface of the first seed layer 60a and the first mask pattern MK1 in the first mask opening MO1 may be between about 87° and about 90°. In some embodiments, when the first mask pattern MK1 is formed of a positive photoresist, the first mask pattern MK1 may have a tapered shape in which a horizontal width thereof narrows away from the first seed layer 60a.

The first mask pattern MK1 may include at least one separation mask pattern SMP defined by the first mask opening MO1. The at least one separation mask pattern SMP may be apart from the first mask pattern MK1 with the first mask opening MO1 therebetween, to be separated from the other portions of the first mask pattern MK1.

Referring to FIGS. 2B and 2C, a first conductive pattern 62a filling the first mask opening MO1 may be formed, and the first mask pattern MK1 may be removed.

In some embodiments, the first conductive pattern 62a may be formed by performing electroless plating by using the first seed layer 60a. The first conductive pattern 62a may include a same material as the first seed layer 60a or a material having similar etching characteristics as those of a material of the first seed layer 60a. The first conductive pattern 62a may include, for example, a copper or a copper alloy.

In other embodiments, the first conductive pattern 62a may be formed by performing a physical vapor deposition method or a chemical vapor deposition method. For example, the first conductive pattern 62a may be formed by depositing a conductive material layer on the first mask pattern MK1 having the first mask opening MO1 by performing a physical vapor deposition method or a chemical vapor deposition method, and performing a lift-off process of removing the first mask pattern MK1. The first conductive pattern 62a may be a portion of the conductive material layer that fills the first mask opening MO1. When forming the first conductive pattern 62a by using a physical vapor deposition method or a chemical vapor deposition method, the first seed layer 60a may be omitted.

A side surface of the first conductive pattern 62a may be perpendicular or near-perpendicular to the upper surface of the first seed layer 60a. For example, an acute angle between the upper surface of the first seed layer 60a and the side surface of the first conductive pattern 62a may be between about 87° and about 90°. In some embodiments, the first conductive pattern 62a may have a tapered shape in which a horizontal width thereof is increased away from the first seed layer 60a.

The first conductive pattern 62a may define at least one separation space SS. The at least one separation space SS may correspond to the at least one separation mask pattern SMP, and may be formed by removing the at least one separation mask pattern SMP.

Referring to FIG. 2D, a first insulating layer 70a having a first opening OP1 is formed on the first seed layer 60a on which the first conductive pattern 62a is formed. The first insulating layer 70a may be formed of, for example, a PID or PSPI.

The first insulating layer 70a may vertically overlap a portion of the first conductive pattern 62a and not overlap the other portions of the first conductive pattern 62a and the separation space SS. A horizontal width and a horizontal area of the first opening OP1 may be greater than a horizontal width and a horizontal area of the separation space SS, and the separation space SS may completely overlap the first opening OP1 in a vertical direction. The first opening OP1 and the separation space SS may communicate with each other. The first opening OP1 may have a tapered shape in which a horizontal width thereof narrows downwards, on the first conductive pattern 62a.

The first insulating layer 70a may cover a portion of an upper surface of the first conductive pattern 62a and a portion of a side surface of the first conductive pattern 62a adjacent thereto. The first insulating layer 70a may cover a portion of the upper surface of the first seed layer 60a that is not covered by the first conductive pattern 62a. The first insulating layer 70a may not cover a portion of the upper surface of the first seed layer 60a that is exposed on a bottom surface of the separation space SS. For example, the first insulating layer 70a may not cover the separation space SS and a portion of the first conductive pattern 62a that is adjacent to the separation space SS.

Referring to FIG. 2E, a second barrier conductive layer 50b and a second seed layer 60b may be sequentially formed on the first seed layer 60a on which the first conductive pattern 62a and the first insulating layer 70a are formed. The second barrier conductive layer 50b and the second seed layer 60b may be formed by performing a physical vapor deposition method such as a sputtering process. The second barrier conductive layer 50b and the second seed layer 60b may be conformally formed to cover respective exposed surfaces of the first conductive pattern 62a, the first insulating layer 70a, and the first seed layer 60a with an approximately uniform thickness. In some embodiments, the second barrier conductive layer 50b and the second seed layer 60b may each have a thickness of 1 μm or less. For example, the second barrier conductive layer 50b and the second seed layer 60b may each have a thickness of about 0.1 μm.

In some embodiments, the second barrier conductive layer 50b may include a same material as the first barrier conductive layer 50a. In some embodiments, the second seed layer 60b may include a same material as the first seed layer 60a.

The second barrier conductive layer 50b and the second seed layer 60b may sequentially cover respective exposed surfaces of the first seed layer 60a and the first conductive pattern 62a on a bottom surface and a sidewall in the separation space SS, that is, in the separation space SS, and sequentially cover respective exposed surfaces of the first conductive pattern 62a and the first insulating layer 70a outside the separation space SS.

Referring to FIG. 2F, a second mask pattern MK2 having a second mask opening MO2 may be formed on the second seed layer 60b. The second mask pattern MK2 may be formed of, for example, a photoresist. In some embodiments, the second mask opening MO2 may have a horizontal width of about 200 μm or greater.

The second mask pattern MK2 may not overlap with each of the first opening OP1 and the separation space SS in a vertical direction. A horizontal width and a horizontal area of the second mask opening MO2 may be greater than the horizontal width and the horizontal area of each of the first opening OP1 and the separation space SS, and the first opening OP1 and the separation space SS may both overlap in the second mask opening MO2 in a vertical direction.

The second mask pattern MK2 may have a side surface that is perpendicular or near-perpendicular to an uppermost surface of the second seed layer 60b in the second mask opening M02. For example, an acute angle between the uppermost surface of the second seed layer 60b and the side surface of the second mask pattern MK2 in the second mask opening MO2 may be between about 87° and about 90°. In some embodiments, when the second mask pattern MK2 is formed of a positive photoresist, the second mask pattern MK2 may have a tapered shape in which a horizontal width thereof narrows away from the second seed layer 60b.

Referring to FIGS. 2F and 2G together, a second conductive pattern 62b filling the second mask opening MO2 may be formed, and the second mask pattern MK2 may be removed. The second conductive pattern 62b may be formed by performing a similar method to a method of forming the first conductive pattern 62a and using a same material as that of the first conductive pattern 62a.

A side surface of the second conductive pattern 62b may be perpendicular or near-perpendicular to the uppermost surface of the second seed layer 60b. For example, an acute angle between the uppermost surface of the second seed layer 60b and the side surface of the second conductive pattern 62b may be between about 87° and about 90°. In some embodiments, the second conductive pattern 62b may have a tapered shape in which a horizontal width thereof is increased away from the second seed layer 60b.

The second conductive pattern 62b may have a vertical level in which an upper surface of a portion thereof overlapping the first opening OP1 and the separation space SS is lower than an upper surface of a portion thereof overlapping the first insulating layer 70a in a vertical direction. An upper surface of the second conductive pattern 62b may have a concave shape in which a vertical level of a central portion thereof is lower than that of an edge thereof.

Referring to FIGS. 2G and 2H together, the first insulating layer 70a may be exposed by removing a portion of the second seed layer 60b arranged under the second mask pattern MK2 illustrated in FIG. 2F and the portion of the second barrier conductive layer 50b thereunder, that is, a portion of the second seed layer 60b not covered by the second conductive pattern 62b and a portion of the second barrier conductive layer 50b thereunder. The portion of the second seed layer 60b and the portion of the second barrier conductive layer 50b thereunder may also be removed by using the second conductive pattern 62b as an etching mask.

An acute angle between the upper surface of the first seed layer 60a and side surfaces of a portion of the second barrier conductive layer 50b, a portion of the second seed layer 60b, and a portion of the second conductive pattern 62b, located on a vertical level between the upper surface of the first conductive pattern 62a and an upper surface of the first insulating layer 70a, that is, a portion of the second barrier conductive layer 50b, a portion of the second seed layer 60b, and a portion of the second conductive pattern 62b that are in the first opening OP1, and may be about 70° to about 85°. In some embodiments, the portion of the second barrier conductive layer 50b, the portion of the second seed layer 60b, and the portion of the second conductive pattern 62b in the first opening OP1 may have a tapered shape in which a horizontal width thereof narrows downwards.

Referring to FIG. 2I, a second insulating layer 70b having a second opening OP2 is formed on the second conductive pattern 62b and the first insulating layer 70a. The second insulating layer 70b may be formed of, for example, PID or PSPI. A portion of the upper surface of the second conductive pattern 62b may be exposed on a bottom surface of the second opening OP2.

Next, by using a similar method to that of forming the second barrier conductive layer 50b, the second seed layer 60b, and the second conductive pattern 62b on the first insulating layer 70a having the first opening OP1, a third barrier conductive layer 50c, a third seed layer 60c, and a third conductive pattern 62c may be formed on the second insulating layer 70b having the second opening OP2. Also, although not illustrated, in some embodiments, by repeating the method described with reference to FIG. 2I, an additional conductive pattern and an additional insulating layer may be further formed on the third conductive pattern 62c and the second insulating layer 70b.

Referring to FIGS. 2I and 2J together, the first barrier conductive layer 50a may be exposed by separating the carrier substrate 10 by removing a laser reactive layer or a thermal reactive layer included in the release film 12 or by weakening a bonding force between the laser reactive layer or the thermal reactive layer and the first barrier conductive layer 50a by irradiating laser to or heating the release film 12.

Referring to FIGS. 2J and 2K together, the first barrier conductive layer 50a is removed. In some embodiments, the first barrier conductive layer 50a may be removed by performing a wet etching process. As the first barrier conductive layer 50a includes a material that has etching selectivity with respect to the first seed layer 60a, after the first barrier conductive layer 50a is removed, the first seed layer 60a may not be removed, but may be exposed.

Referring to FIGS. 2K and 2L together, the first seed layer 60a and the first conductive pattern 62a are removed. In some embodiments, the first seed layer 60a and the first conductive pattern 62a may be removed by performing a wet etching process. The first seed layer 60a and the first conductive pattern 62a may include a same material or a material having similar etching characteristics, and thus, may be removed together. After the first seed layer 60a and the first conductive pattern 62a are removed, the second barrier conductive layer 50b and the first insulating layer 70a may be exposed.

The first insulating layer 70a may have the recess area RS from which the first conductive pattern 62a is removed. In the recess area RS, a sidewall of the first insulating layer 70a may be apart from the second barrier conductive layer 50b.

A portion of the first insulating layer 70a that defines the first opening OP1 and has an equal vertical level as the first opening OP1 may be referred to as an insulating support portion 70aS, and a portion of the first insulating layer 70a that defines the recess area RS and has a same vertical level as the recess area RS may be referred to as an insulation dam portion 70aD.

Referring to FIGS. 2L and 2M together, a portion of the second barrier conductive layer 50b is removed. By removing a portion of the second barrier conductive layer 50b that is not covered by the second insulating layer 70b, that is, a portion of the second barrier conductive layer 50b covering a portion of the second seed layer 60b covering a lower surface of the second conductive pattern 62b and removing a portion of the second barrier conductive layer 50b that is exposed in the recess area RS and is apart from the first insulating layer 70a, only a portion of the second barrier conductive layer 50b that contacts the first insulating layer 70a may be left. In some embodiments, the lower surfaces of the first insulating layer 70a and the second barrier conductive layer 50b may be coplanar in the recess area RS.

Portions of the second seed layer 60b and the second conductive pattern 62b that are enveloped by the second insulating layer 70b and have a same vertical level as the second insulating layer 70b may be a pad layer PAD, and portions of the second seed layer 60b and the second conductive pattern 62b that are enveloped by the first insulating layer 70a and have a same vertical level as the first insulating layer 70a may be a UBM layer UBM. A portion of the UBM layer UBM that is defined by the first opening OP1 and has a same vertical level as the first opening OP1 may be a body portion U-B, and a portion of the UBM layer UBM that is defined by the recess area RS and has a same vertical level as the recess area RS may be a protrusion U-P. The protrusion U-P may protrude from the body portion U-B. The third barrier conductive layer 50c, the third seed layer 60c, and the third conductive pattern 62c may be a support wiring conductive structure R-C.

The insulating support portion 70aS may contact the body portion U-B and envelop the body portion U-B, and the insulation dam portion 70aD may be apart from the protrusion U-P and envelop the protrusion U-P. For example, the insulating support portion 70aS may be at the same vertical level as and may surround the body portion U-B, and the insulation dam portion 70aD may be at the same vertical level as and may be spaced apart from the protrusion U-P.

The pad layer PAD may be the lower surface pad 134 illustrated in FIG. 1, and the UBM layer UBM may be the UBM layer 140 illustrated in FIG. 1, and the body portion U-B and the protrusion U-P may be respectively the body portion 142 and the protrusion 144 illustrated in FIG. 1. The first insulating layer 70a and the second insulating layer 70b may be respectively the support wiring insulating layer 110 at the lowermost end and the support wiring insulating layer 110 at the next end to the lowermost end from among the plurality of support wiring insulating layers 110 included in the support wiring structure 100 illustrated in FIG. 1. The first insulating layer 70a and the second insulating layer 70b may be respectively referred to as a first support wiring insulating layer and a second support wiring insulating layer. The support wiring conductive structure R-C may be a portion of the support wiring conductive structure 120 illustrated in FIG. 1.

An upper surface of the pad layer PAD may have a concave shape in which a vertical level of a central portion thereof is lower than that of an edge thereof. For example, an upper surface of a portion of the pad layer PAD, the portion vertically overlapping the body portion U-B and the protrusion U-P of the UBM layer UBM, may have a lower vertical level than an upper surface of an edge of the pad layer PAD.

An acute angle between a side surface of the body portion U-B and a lower surface of the pad layer PAD may be between about 70° and about 85°. In some embodiments, the body portion U-B may have a tapered shape in which a horizontal width thereof narrows away from the pad layer PAD.

The protrusion U-P may have a first height H1 in a vertical direction, and the body portion U-B may have a second height H2 in the vertical direction. The first height H1 may be about 10 μm to about 30 μm, and the second height H2 may be about 5 μm to about 15 μm. In some embodiments, the first height H1 may have a greater value than the second height H2.

The protrusion U-P may have a first width W1 in a horizontal direction, and the body portion U-B may have a second width W2, the second width W2 being greater than the first width W1. The recess area RS may have a third width W3 that is greater than the second width W2 in the horizontal direction. When the UBM layer UBM includes a single protrusion U-P protruding from the body portion U-B, the first width W1 may be about 120 μm to about 270 μm, and the second width W2 may be about 200 μm to about 280 μm. The third width W3 may be about 240 μm to about 400 μm.

A side surface of the protrusion U-P may be perpendicular or near-perpendicular to a lower surface of the body portion U-B. For example, an acute angle between the side surface of the protrusion U-P and the lower surface of the body portion U-B may be between about 87° and about 90°. In some embodiments, the protrusion U-P may have a tapered shape in which a horizontal width thereof is increased away from the body portion U-B.

The protrusion U-P may be apart from an edge of the body portion U-B and protrude from an inner side of the body portion U-B. A distance L1 from the edge of the body portion U-B to the protrusion U-P may be about 5 μm to about 30 μm.

A lower surface of the protrusion U-P and a lower surface of the first insulating layer 70a may be approximately at a same vertical level. In some embodiments, the lower surface of the protrusion U-P may be located in the recess area RS at a first depth D1 from the lower surface of the first insulating layer 70a. In some embodiments, the first depth D1 may have a value equal to or less than 0.5 μm. For example, the first depth D1 may be about 0.1 μm. For example, a depth of the recess area RS may be about 10 μm to about 30 μm, which is similar to the first height H1.

The second barrier conductive layer 50b may cover the lower surface of the pad layer PAD and the side surface of the body portion U-B. The second barrier conductive layer 50b may be arranged to extend from between the lower surface of the pad layer PAD and the first insulating layer 70a to between the side surface of the body portion U-B and the first insulating layer 70a. The second barrier conductive layer 50b may not cover a surface of the protrusion U-P. For example, the second barrier conductive layer 50b may not cover the side surface and the lower surface of the protrusion U-P. The second barrier conductive layer 50b may have a first thickness T1 in a vertical direction. The first depth D1, which is a difference in vertical levels of the lower surface of the protrusion U-P and the lower surface of the first insulating layer 70a, is formed by removing the second barrier conductive layer 50b, and thus, the first thickness T1 may be substantially equal to the first depth D1.

Referring to FIG. 2N, a connection terminal SB filling a portion of the recess area RS may be attached to the UBM layer UBM. The connection terminal SB may be a solder ball. The connection terminal SB may surround the protrusion U-P on the body portion U-B. Accordingly, a bonding area between the connection terminal SB and the UBM layer UBM may increase.

In some embodiments, the connection terminal SB may be apart from an inner wall of the recess area RS. For example, the connection terminal SB may be spaced apart from a side surface of the first insulating layer 70a in the recess area RS, but embodiments are not limited thereto. In other embodiments, the connection terminal SB may be in contact with the inner wall of the recess area RS. For example, the connection terminal SB may be in contact with the side surface of the first insulating layer 70a in the recess area RS, and the insulation dam portion 70aD of the first insulating layer 70a defining the recess area RS may perform a dam function to prevent a solder which constitutes the connection terminal SB from flowing to the surroundings during a process of forming the connection terminal SB.

Figure 3A:
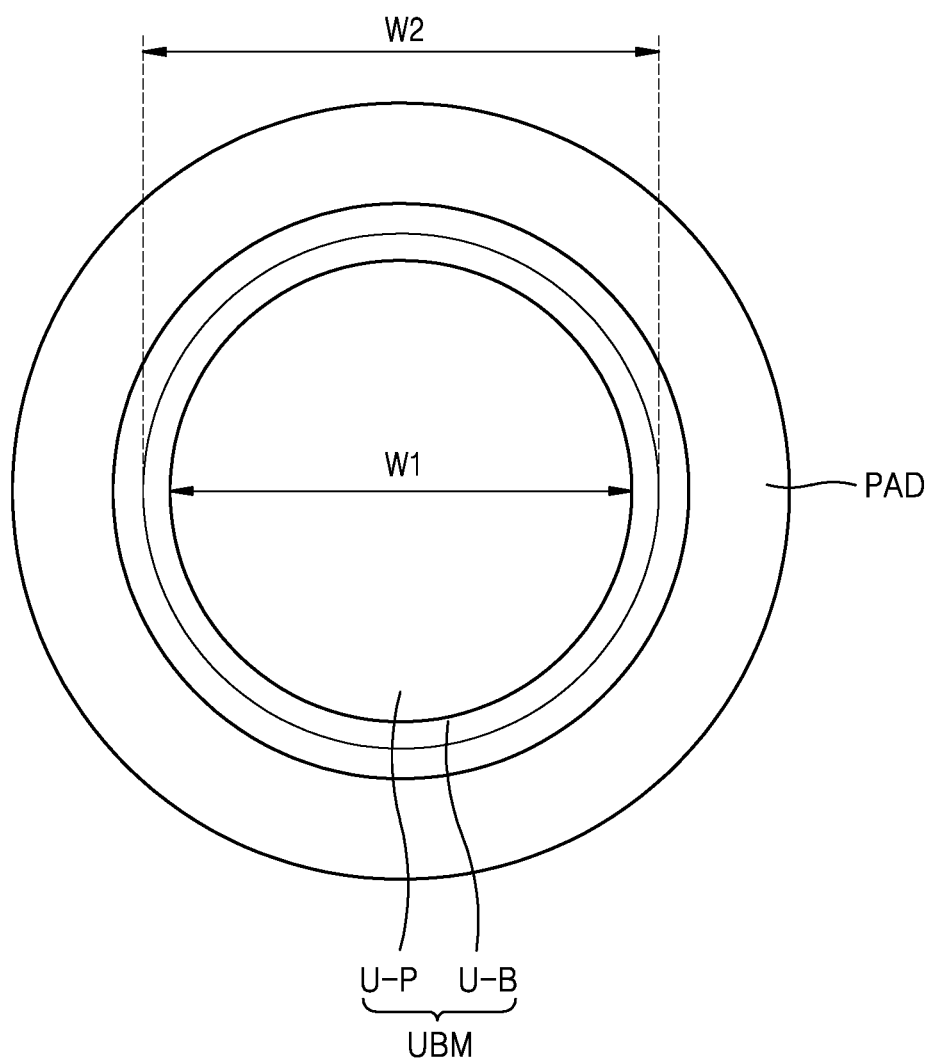
FIGS. 3A and 3B are plan views illustrating a UBM layer included in a fan-out semiconductor package, according to example embodiments.
Figure 3B:
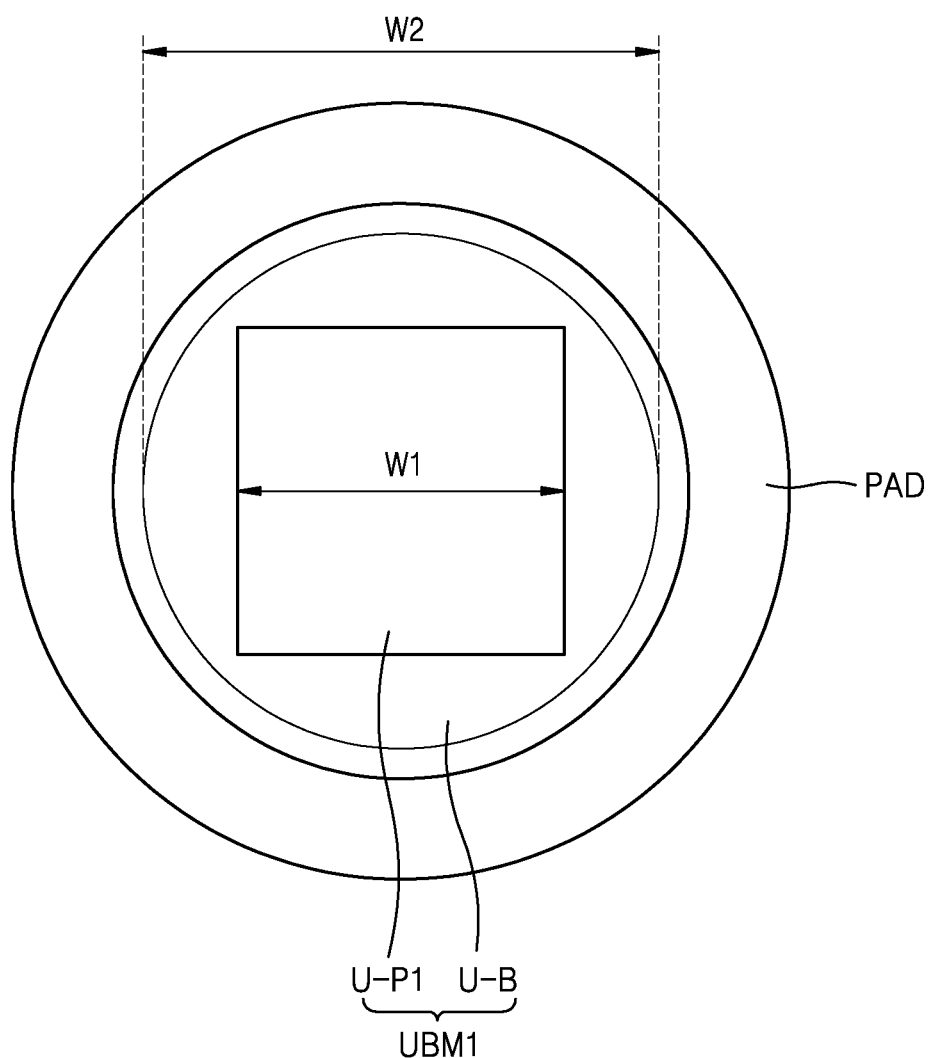

FIGS. 3A and 3B are plan views illustrating a UBM layer included in a fan-out semiconductor package according to example embodiments.

Referring to FIG. 3A, a UBM layer UBM including a body portion U-B and a protrusion U-P may be arranged on a pad layer PAD. In some embodiments, the pad layer PAD and the UBM layer UBM may be integrally formed. The body portion U-B may have a tapered shape in which a horizontal width thereof narrows away from the pad layer PAD.

In some embodiments, the protrusion U-P of the UBM layer UBM may have a circular or oval horizontal shape.

Referring to FIG. 3B, a UBM layer UBM1 including a body portion U-B and a protrusion U-P1 may be arranged on a pad layer PAD. In some embodiments, the pad layer PAD and the UBM layer UBM1 may be integrally formed.

In some embodiments, the protrusion U-P1 of the UBM layer UBM1 may have a quadrangular or polygonal horizontal shape.

FIGS. 4A through 4M are cross-sectional views illustrating a method of manufacturing a UBM layer, which is included in a fan-out semiconductor package according to example embodiments and to which a connection terminal is attached. In FIGS. 4A through 4M, like reference numerals as those of FIGS. 2A through 2N denote like elements, and repeated details may be omitted.

Figure 4A:
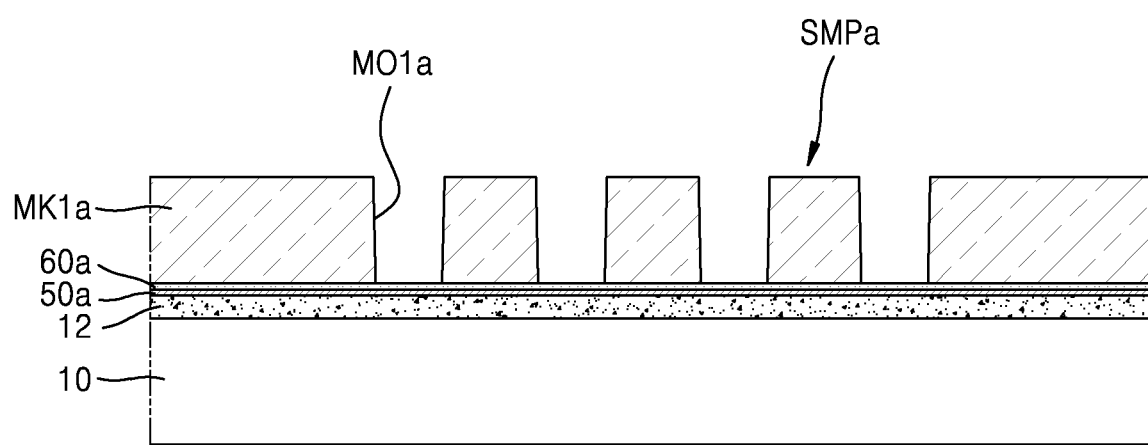
FIGS. 4A through 4M are cross-sectional views illustrating a method of manufacturing a UBM layer, which is included in a fan-out semiconductor package, according to example embodiments and to which a connection terminal is attached.

Referring to FIG. 4A, after sequentially forming the first barrier conductive layer 50a and the first seed layer 60a on the release film 12 attached to the carrier substrate 10, a first mask pattern MK1a having a first mask opening MO1a is formed on the first seed layer 60a. The first mask pattern MK1a may be formed of, for example, a photoresist. In some embodiments, the first mask opening MO1a may have a horizontal width of about 20 µm or greater.

The first mask pattern MK1a may include a separation mask pattern SMPa defined by the first mask opening MO1a. The separation mask pattern SMPa may be apart from the first mask pattern MK1a with the first mask opening MO1a therebetween, to be separated from the other portions of the first mask pattern MK1a. In some embodiments, one separation mask pattern SMPa may be included, and a plurality of first mask openings MO1a may be included, and some of the plurality of first mask openings MO1a may be defined by the separation mask pattern SMPa. In other embodiments, a plurality of separation mask patterns SMPa may be included, and a single first mask opening MO1a extending along and communicating through the plurality of separation mask patterns SMPa may be included. In other embodiments, a plurality of separation mask patterns SMPa and a plurality of first mask openings MO1a may be included.

Figure 4B:
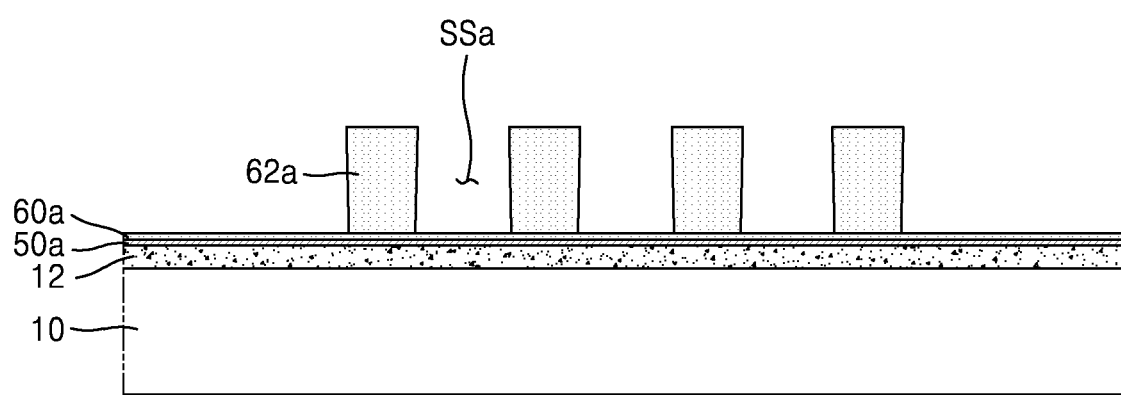

Referring to FIGS. 4A and 4B, a first conductive pattern 62a filling the first mask opening MO1a may be formed, and the first mask pattern MK1a may be removed. The first conductive pattern 62a may define one or more separation spaces SSa.

Figure 4C:
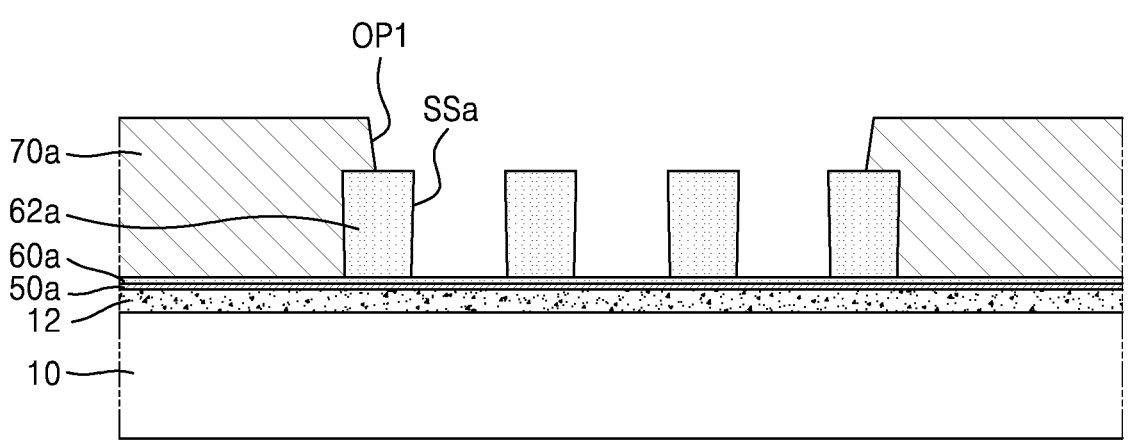

Referring to FIG. 4C, a first insulating layer 70a having a first opening OP1 is formed on the first seed layer 60a on which the first conductive pattern 62a is formed.

The first insulating layer 70a may vertically overlap a portion of the first conductive pattern 62a and not overlap the other portions of the first conductive pattern 62a and the separation space SSa. A horizontal width and a horizontal area of the first opening OP1 may be greater than a horizontal width and a horizontal area of the separation space SSa, and the separation space SSa may completely overlap the first opening OP1 in a vertical direction. The first opening OP1 and the separation space SSa may communicate with each other.

Figure 4D:
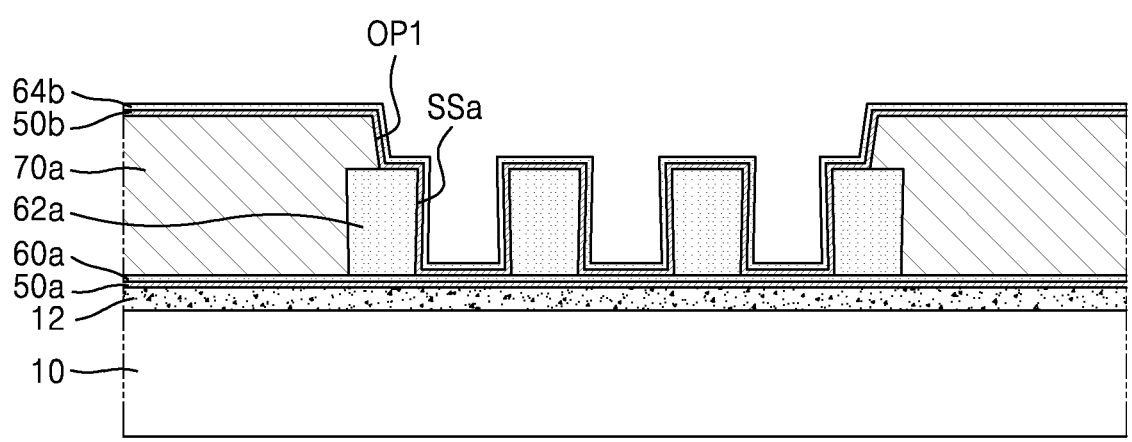

Referring to FIG. 4D, a second barrier conductive layer 50b and a second seed layer 60b may be sequentially formed on the first seed layer 60a on which the first conductive pattern 62a and the first insulating layer 70a are formed.

The second barrier conductive layer 50b and the second seed layer 60b may sequentially cover respective exposed surfaces of the first seed layer 60a and the first conductive pattern 62a on a bottom surface and a sidewall in the separation space SSa, that is, in the separation space SSa, and sequentially cover respective exposed surfaces of the first conductive pattern 62a and the first insulating layer 70a outside the separation space SSa.

Figure 4E:
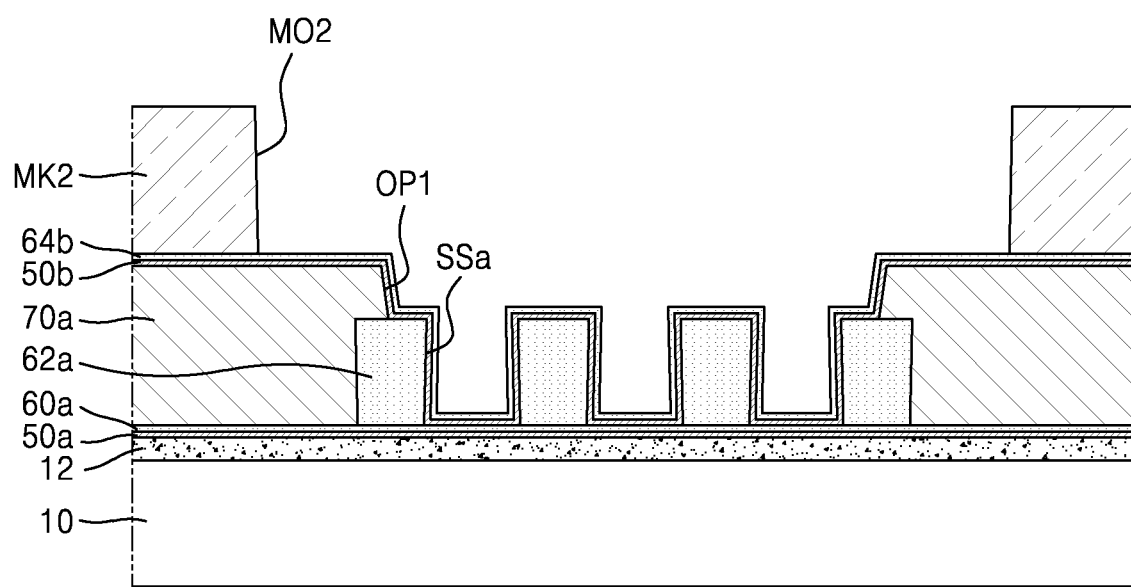

Referring to FIG. 4E, a second mask pattern MK2 having a second mask opening MO2 may be formed on the second seed layer 60b.

Figure 4F:
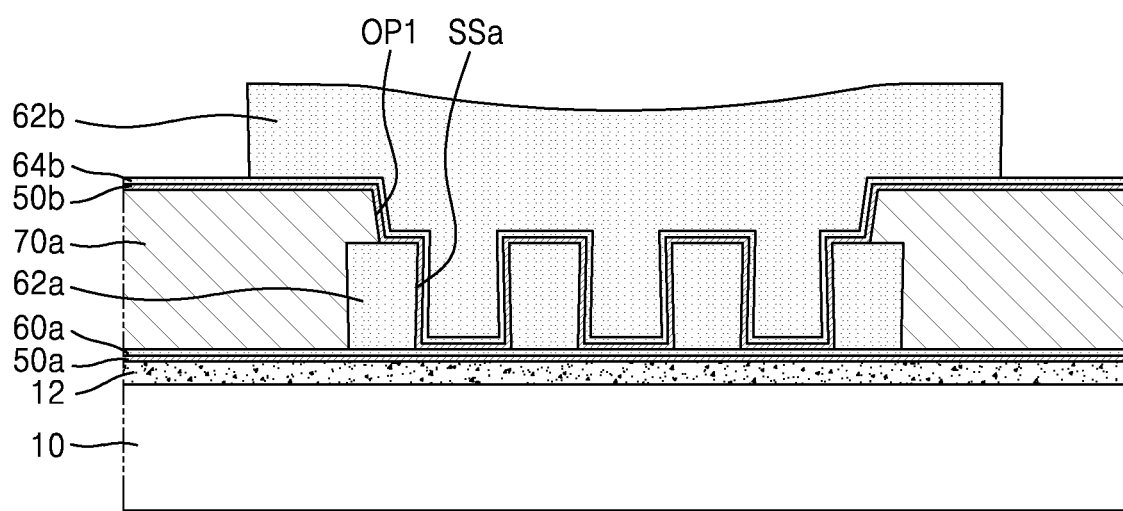

Referring to FIGS. 4E and 4F together, a second conductive pattern 62b filling the second mask opening MO2 may be formed, and the second mask pattern MK2 may be removed.

Figure 4G:
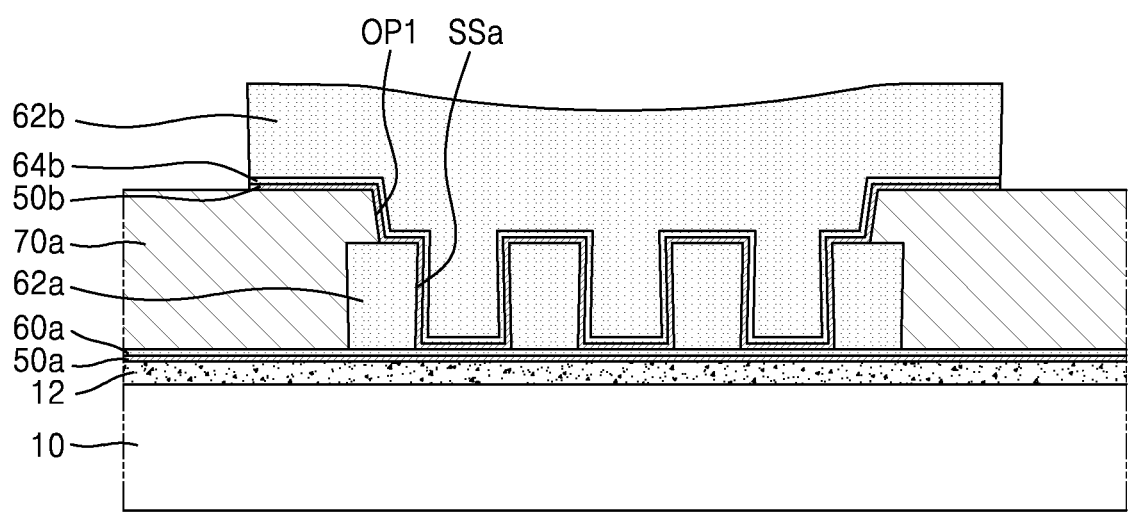

Referring to FIGS. 4F and 4G together, the first insulating layer 70a may be exposed by removing a portion of the second seed layer 60b arranged under the second mask pattern MK2 illustrated in FIG. 2F and the portion of the second barrier conductive layer 50b thereunder, that is, a portion of the second seed layer 60b not covered by the second conductive pattern 62b and a portion of the second barrier conductive layer 50b thereunder.

Figure 4H:
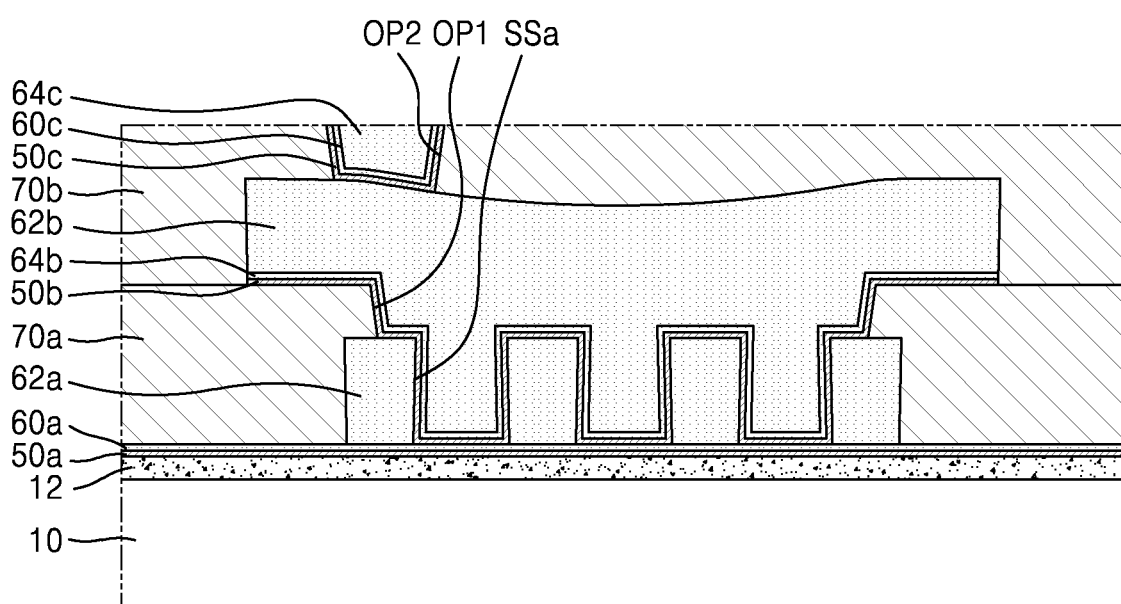

Referring to FIG. 4H, a second insulating layer 70b having a second opening OP2 is formed on the second conductive pattern 62b and the first insulating layer 70a.

Next, a third barrier conductive layer 50c, a third seed layer 60c, and a third conductive pattern 62c may be formed on the second insulating layer 70b having the second opening OP2.

Figure 4I:
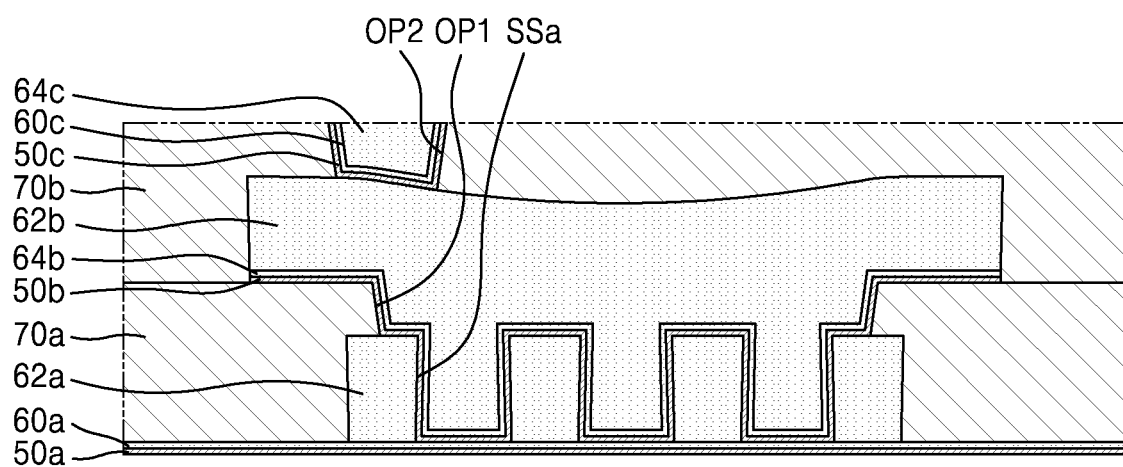

Referring to FIGS. 4H and 4I together, the first barrier conductive layer 50a may be exposed by separating the carrier substrate 10 by irradiating laser to or heating the release film 12.

Figure 4J:
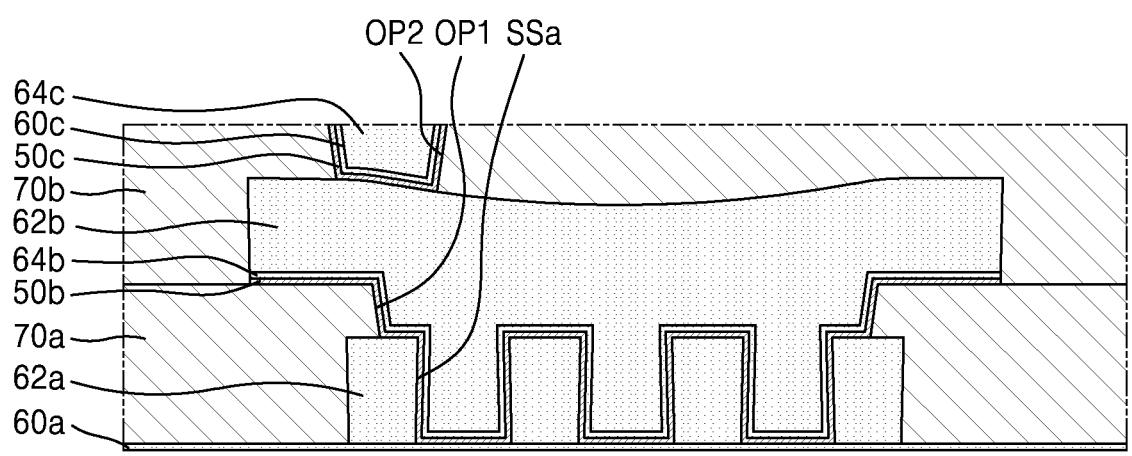

Referring to FIGS. 4I and 4J together, the first barrier conductive layer 50a is removed.

Figure 4K:
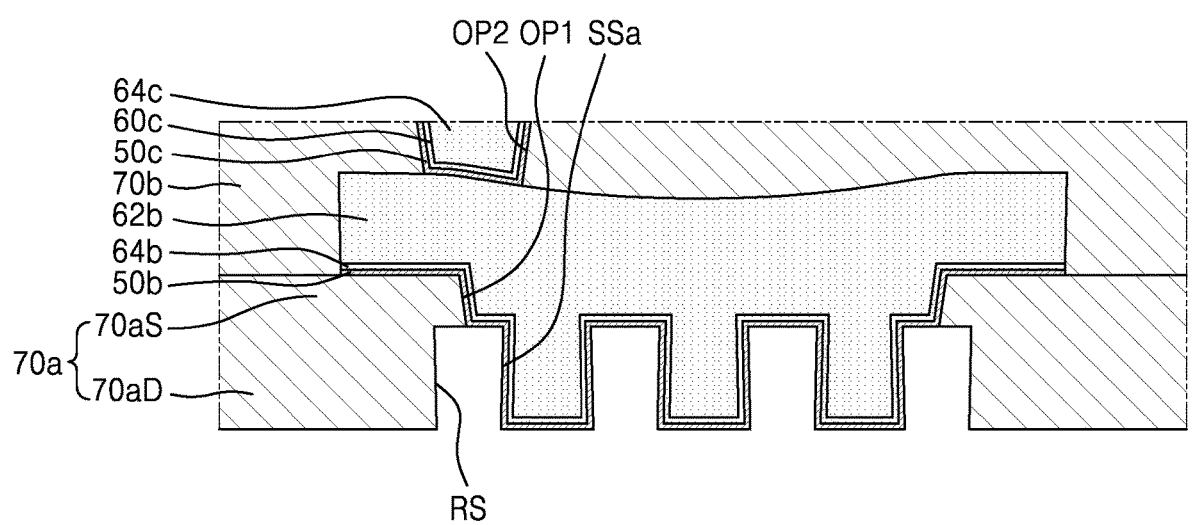

Referring to FIGS. 4J and 4K together, the first seed layer 60a and the first conductive pattern 62a are removed. The first insulating layer 70a may have the recess area RS from which the first conductive pattern 62a is removed. In the recess area RS, a sidewall of the first insulating layer 70a may be apart from the second barrier conductive layer 50b.

Figure 4L:
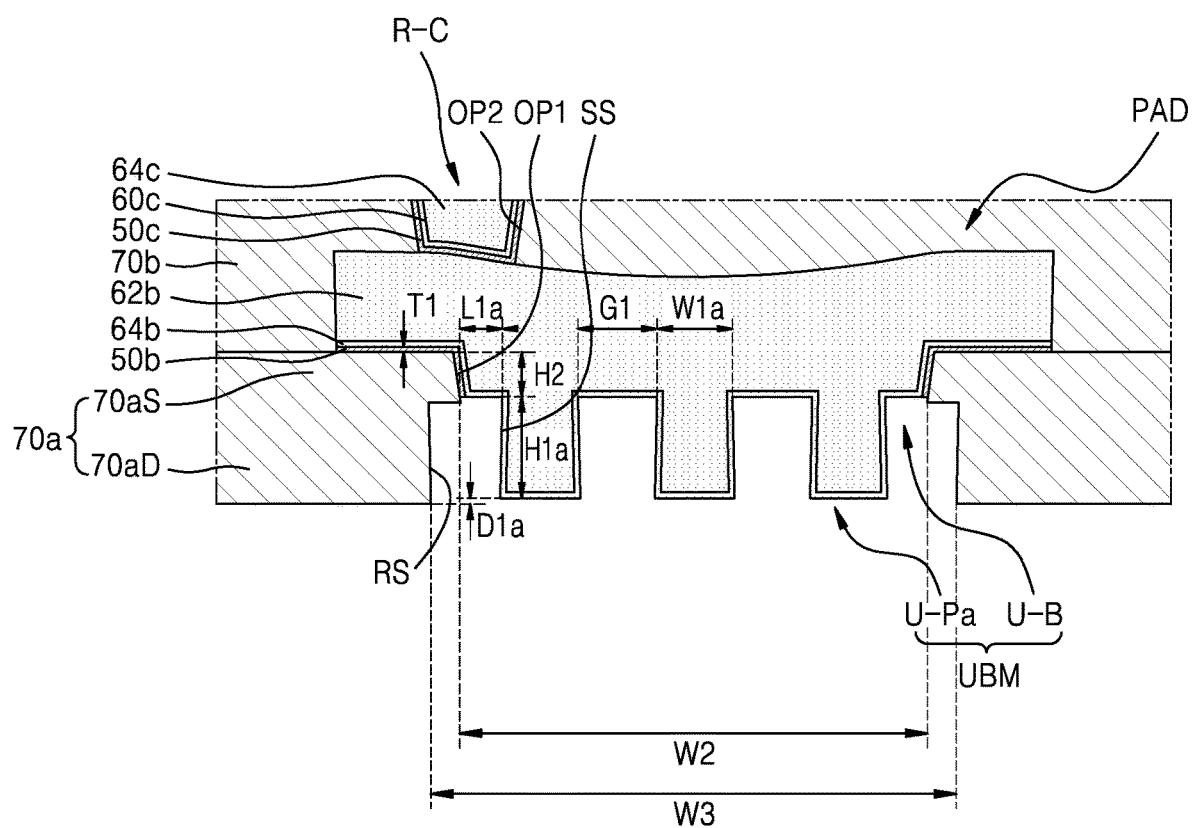

Referring to FIGS. 4K and 4L together, by removing a portion of the second barrier conductive layer 50b, a portion of the second barrier conductive layer 50b contacting the first insulating layer 70a may be left.

Portions of the second seed layer 60b and the second conductive pattern 62b that are enveloped by the second insulating layer 70b and have a same vertical level as the second insulating layer 70b may be a pad layer PAD, and portions of the second seed layer 60b and the second conductive pattern 62b that are enveloped by the first insulating layer 70a and have a same vertical level as the first insulating layer 70a may be a UBM layer UBMa. A portion of the UBM layer UBMa that is defined by the first opening OP1 and has a same vertical level as the first opening OP1 may be a body portion U-B, and a portion of the UBM layer UBM that is defined by the recess area RS and has a same vertical level as the recess area RS may be a protrusion U-Pa. The protrusion U-Pa may protrude from the body portion U-B. The third barrier conductive layer 50c, the third seed layer 60c, and the third conductive pattern 62c may be a support wiring conductive structure R-C.

In some embodiments, the UBM layer UBMa may have a plurality of protrusions U-Pa protruding from the body portion U-B. In other embodiments, the UBM layer UBMa may include a single protrusion U-Pa protruding from the body portion U-B and having a horizontal mesh shape.

The insulating support portion 70aS may contact the body portion U-B and envelop the body portion U-B, and the insulation dam portion 70aD may be apart from the protrusion U-Pa and envelop the protrusion U-Pa. For example, the insulating support portion 70aS may be at the same vertical level as and may surround the body portion U-B, and the insulation dam portion 70aD may be at the same vertical level as and may be spaced apart from the protrusion U-P.

The pad layer PAD may be the upper surface pad 132 illustrated in FIG. 1, and the UBM layer UBMa may be the UBM layer 140 illustrated in FIG. 1, and the body portion U-B and the protrusion U-Pa may be respectively the body portion 142 and the protrusion 144 illustrated in FIG. 1. The support wiring conductive structure R-C may be a portion of the support wiring conductive structure 120 illustrated in FIG. 1.

The protrusion U-Pa may have a first height H1a in a vertical direction, and the body portion U-B may have a second height H2 in the vertical direction. The first height H1a may be about 10 µm to about 30 µm, and the second height H2 may be about 5 µm to about 15 µm. In some embodiments, the first height H1a may have a greater value than the second height H2.

The protrusion U-Pa may have a first width W1a in a horizontal direction, and the body portion U-B may have a second width W2, the second width W2 being greater than the first width W1a. The recess area RS may have a third width W3 greater than the second width W2 in the horizontal direction. The first width W1a may be about 20 µm to about 120 and the second width W2 may be about 200 µm to about 280 µm. The third width W3 may be about 240 µm to about 400 µm.

A first distance G1 which is a distance between a plurality of protrusions U-Pa or a distance between portions of a protrusion U-Pa in the case when the protrusion U-Pa has a horizontal mesh shape may be about 20 µm to about 200 µm.

A side surface of the protrusion U-Pa may be perpendicular or near-perpendicular to the lower surface of the body portion U-B. For example, an acute angle between the side surface of the protrusion U-Pa and the lower surface of the body portion U-B may be between about 87° and about 90°. In some embodiments, the protrusion U-Pa may have a tapered shape in which a horizontal width thereof is increased away from the body portion U-B.

The protrusion U-Pa may be apart from an edge of the body portion U-B and protrude from an inner side of the body portion U-B. A distance L1a from the edge of the body portion U-B to the protrusion U-Pa may be about 5 µm to about 30 µm.

A lower surface of the protrusion U-Pa and a lower surface of the first insulating layer 70a may be approximately at a same vertical level. In some embodiments, the lower surface of the protrusion U-Pa may be located in the recess area RS at a first depth D1a from the lower surface of the first insulating layer 70a. In some embodiments, the first depth D1a may have a value equal to or less than 0.5 µm. For example, the first depth D1a may be about 0.1 µm.

The second barrier conductive layer 50b may cover a lower surface of the pad layer PAD and a side surface of the body portion U-B. The second barrier conductive layer 50b may be arranged to extend from between the lower surface of the pad layer PAD and the first insulating layer 70a to between the side surface of the body portion U-B and the first insulating layer 70a. The second barrier conductive layer 50b may have a first thickness T1 in a vertical direction. The first depth D1a, which is a difference in vertical levels of the lower surface of the protrusion U-Pa and the lower surface of the first insulating layer 70a, is formed by removing the second barrier conductive layer 50b, and thus, the first thickness T1a may be substantially equal to the first depth D1.

Figure 4M:
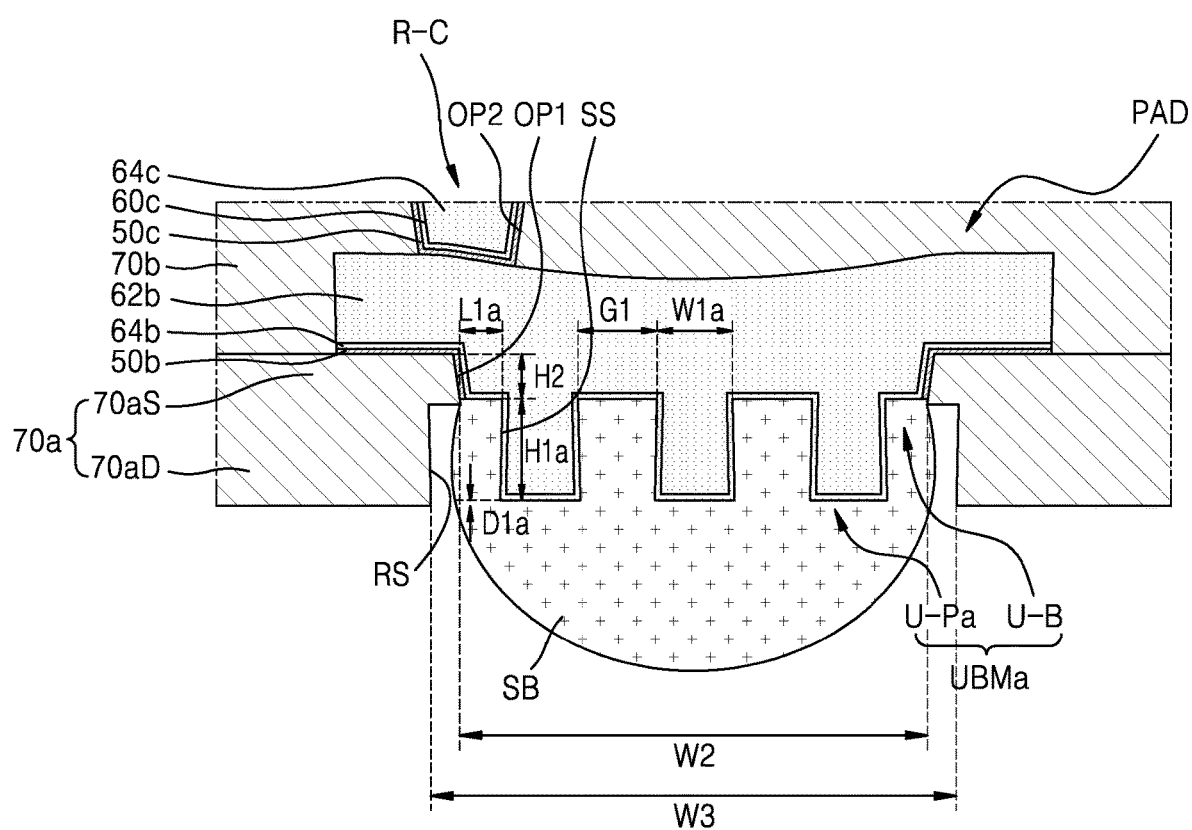

Referring to FIG. 4M, a connection terminal SB filling a portion of the recess area RS may be attached to the UBM layer UBMa. The connection terminal SB may surround the protrusion U-Pa on the body portion U-B. Accordingly, a bonding area between the connection terminal SB and the UBM layer UBMa may increase.

In some embodiments, the connection terminal SB may be apart from an inner wall of the recess area RS. For example, the connection terminal SB may be apart from a side surface of the first insulating layer 70a in the recess area RS, but embodiments are not limited thereto. In other embodiments, the connection terminal SB may be in contact with the inner wall of the recess area RS. For example, the connection terminal SB may be in contact with the side surface of the first insulating layer 70a in the recess area RS, and the insulation dam portion 70aD of the first insulating layer 70a defining the recess area RS may perform a dam function to prevent a solder which constitutes the connection terminal SB from flowing to the surroundings during a process of forming the connection terminal SB.

FIGS. 5A through 5E are plan views illustrating a UBM layer included in a fan-out semiconductor package according to example embodiments.

Figure 5A:
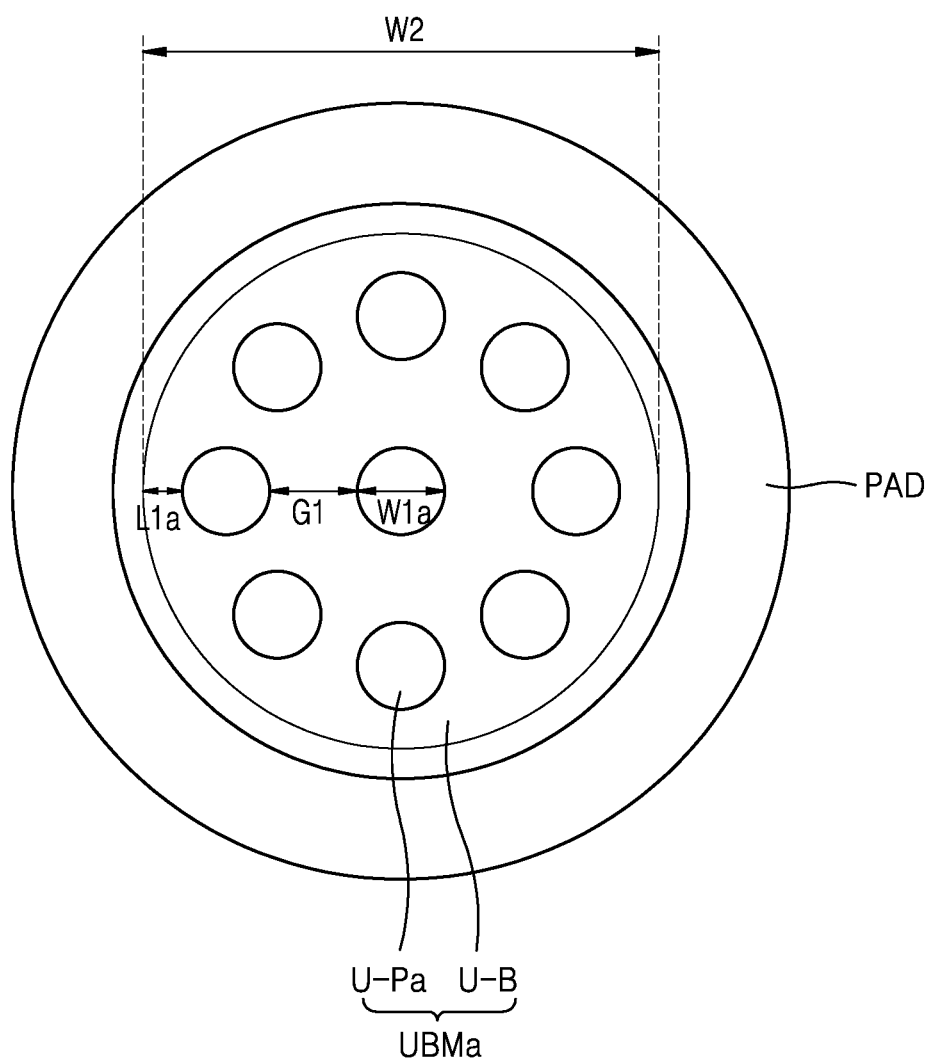
FIGS. 5A through 5E are plan views illustrating a UBM layer included in a fan-out semiconductor package, according to example embodiments.

Referring to FIG. 5A, a UBM layer UBMa including a body portion U-B and a protrusion U-Pa may be arranged on a pad layer PAD. In some embodiments, the pad layer PAD and the UBM layer UBMa may be integrally formed. The body portion U-B may have a tapered shape in which a horizontal width thereof narrows away from the pad layer PAD.

In some embodiments, a plurality of protrusions U-Pa of the UBM layer UBMa may each have a circular or oval horizontal shape.

Figure 5B:
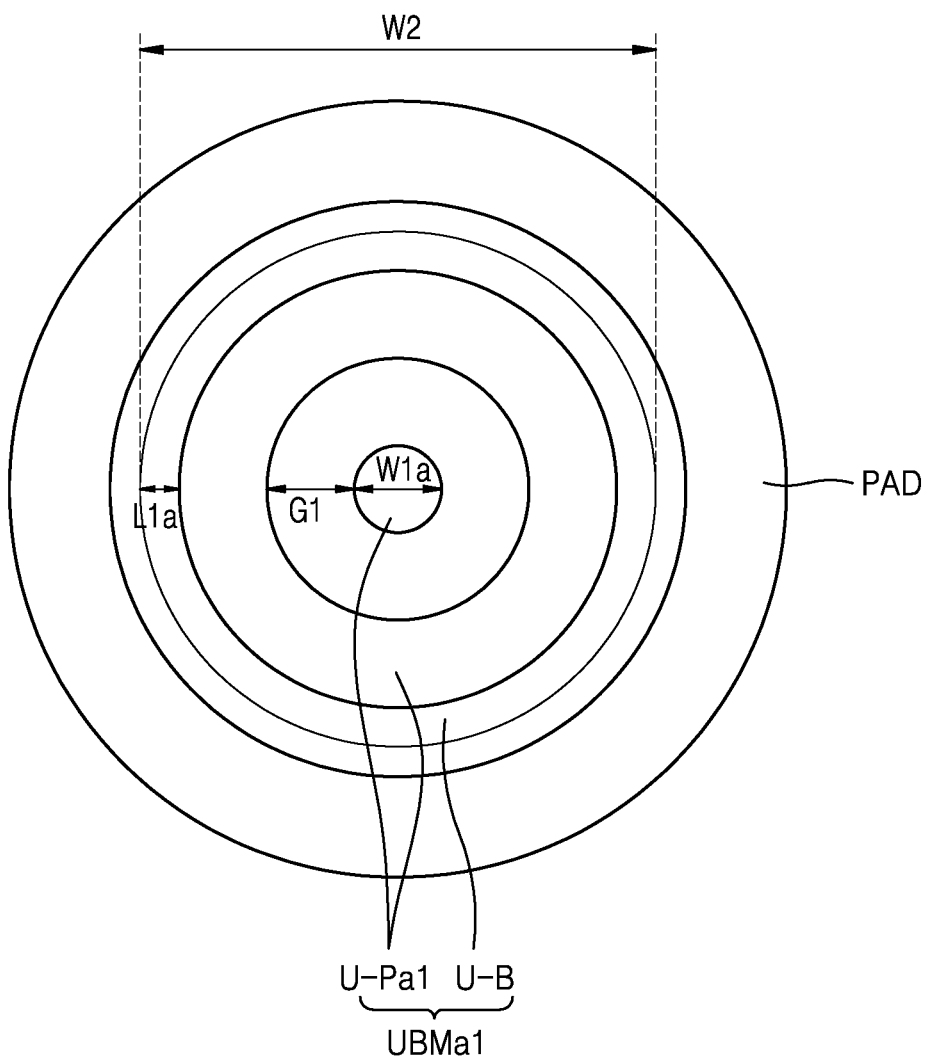

Referring to FIG. 5B, a UBM layer UBMa1 including a body portion U-B and a plurality of protrusion U-Pa1 may be arranged on a pad layer PAD. In some embodiments, the pad layer PAD and the UBM layer UBMa1 may be integrally formed.

In some embodiments, some of the plurality of protrusions U-Pa1 of the UBM layer UBMa1 may have a horizontal ring shape, and some other ones may be apart from the protrusions U-Pa1, be arranged within the protrusions U-Pa1 having a horizontal ring shape, and have a circular or oval horizontal shape.

In other embodiments, the UBM layer UBMa1 may include a body portion U-B and a single protrusion U-Pa1 having a horizontal ring shape.

Figure 5C:
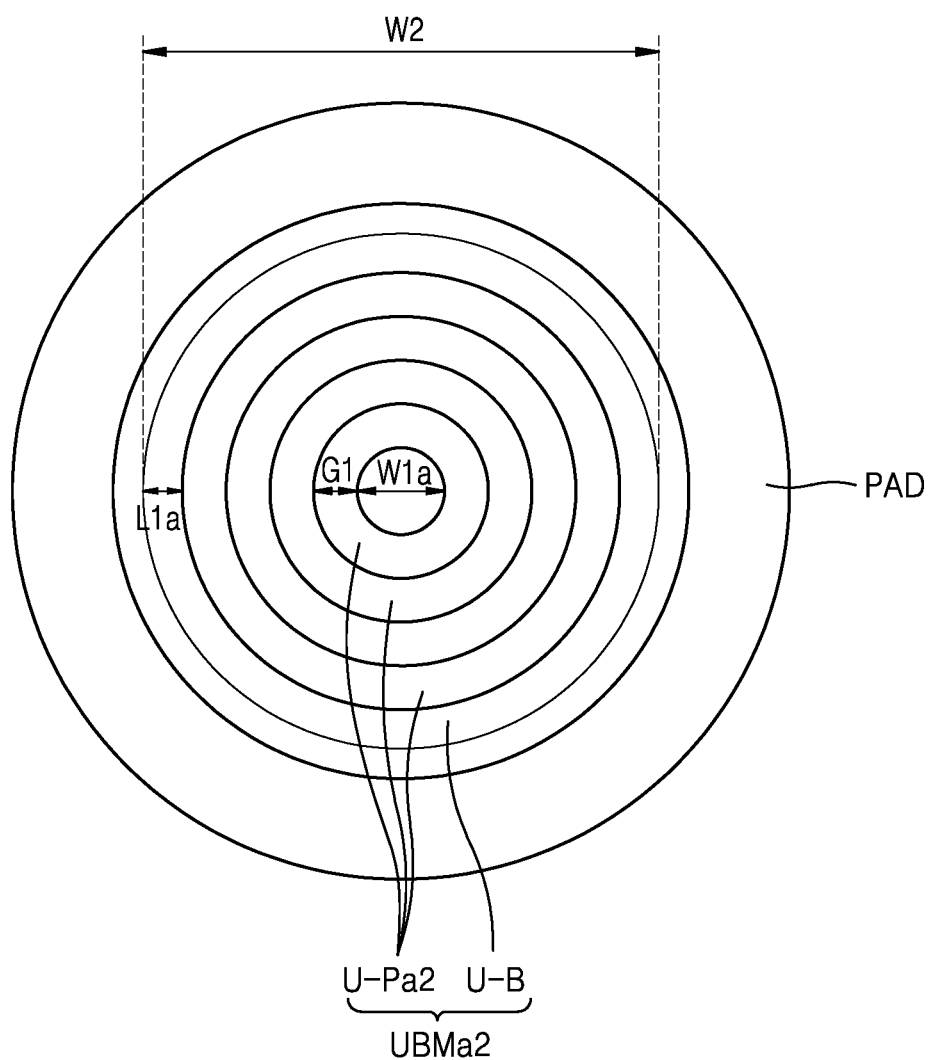

Referring to FIG. 5C, a UBM layer UBMa2 including a body portion U-B and a plurality of protrusions U-Pa2 may be arranged on a pad layer PAD. In some embodiments, the pad layer PAD and the UBM layer UBMa2 may be integrally formed.

In some embodiments, the plurality of protrusions U-Pa2 of the UBM layer UBMa2 may have horizontal ring shapes that are apart from each other, are substantially concentric, and have different diameters.

Figure 5D:
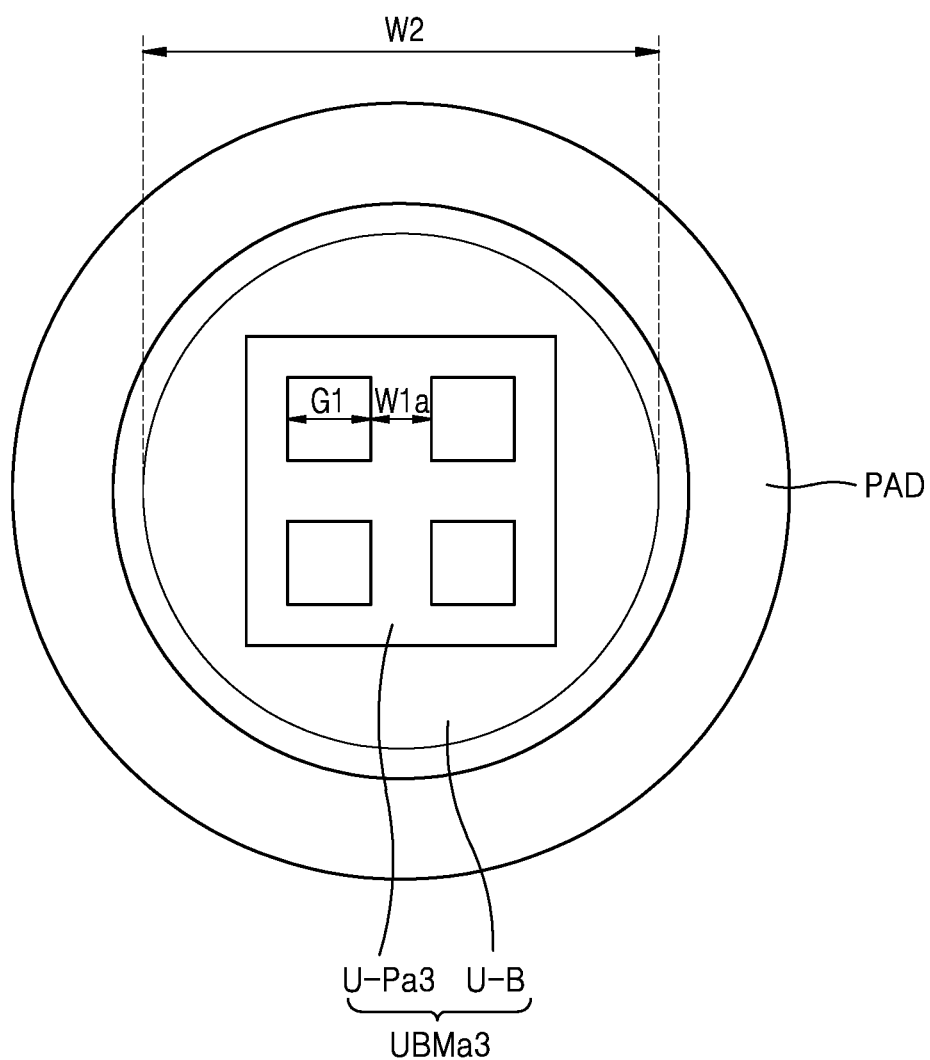

Referring to FIG. 5D, a UBM layer UBMa3 including a body portion U-B and a protrusion U-Pa3 may be arranged on a pad layer PAD. In some embodiments, the pad layer PAD and the UBM layer UBMa3 may be integrally formed.

In some embodiments, the protrusion U-Pa3 of the UBM layer UBMa3 may have a horizontal mesh shape.

Figure 5E:
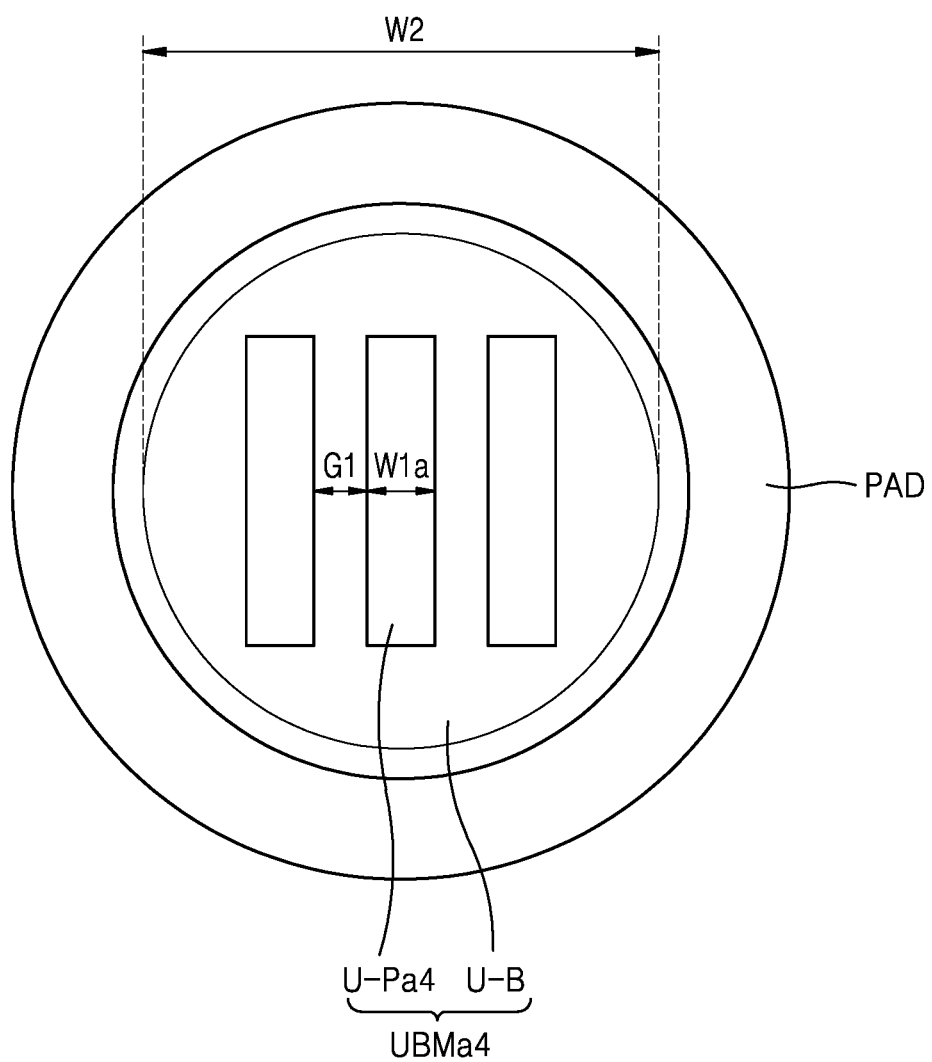

Referring to FIG. 5E, a UBM layer UBMa4 including a body portion U-B and a plurality of protrusions U-Pa4 may be arranged on a pad layer PAD. In some embodiments, the pad layer PAD and the UBM layer UBMa4 may be integrally formed.

In some embodiments, the plurality of protrusions U-Pa4 of the UBM layer UBMa4 may have horizontal bar shapes that are apart from each other.

Figure 6:
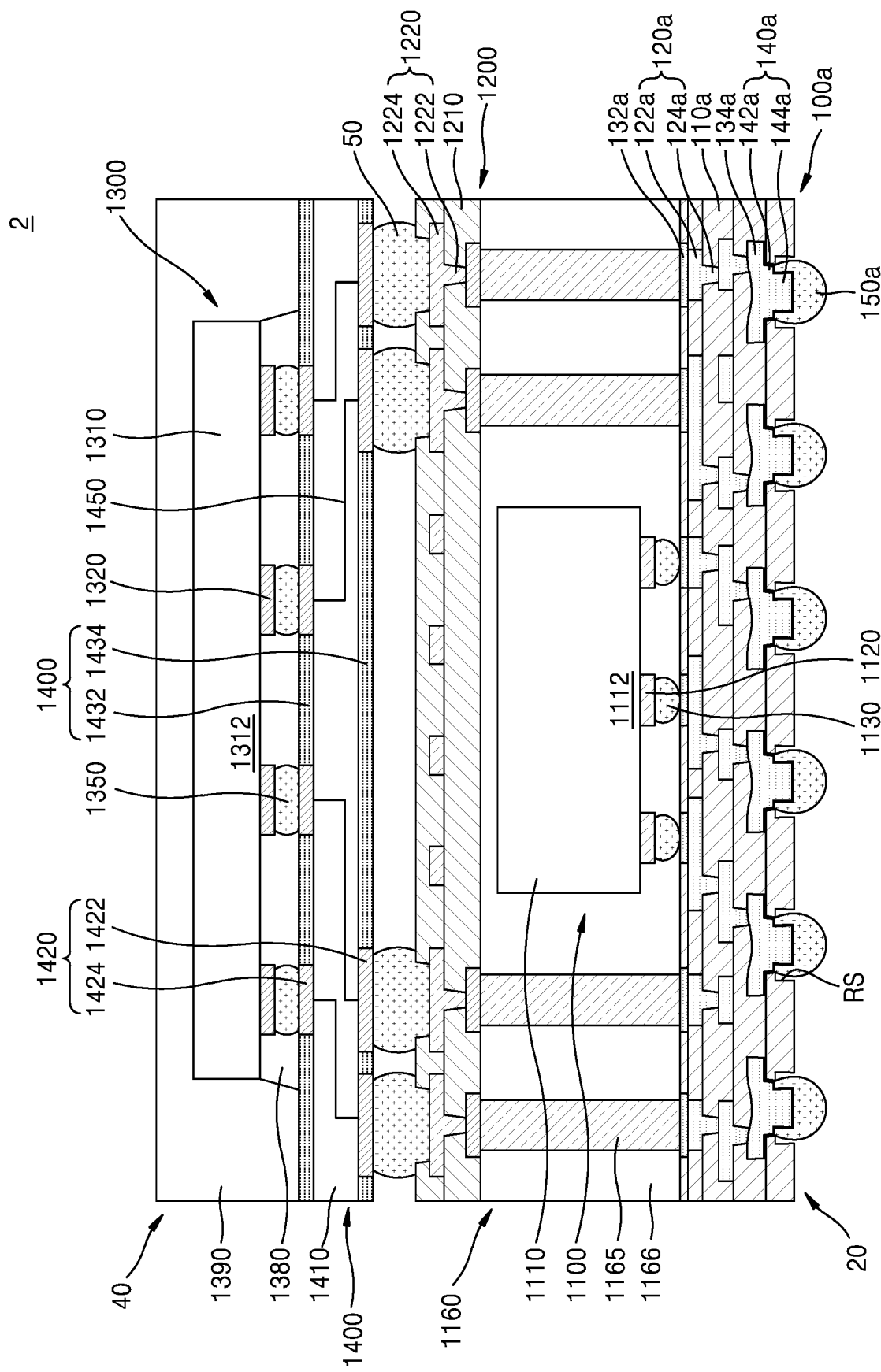
FIG. 6 is a cross-sectional view of a package-on-package including a fan-out semiconductor package, according to example embodiments.

FIG. 6 is a cross-sectional view of a package-on-package including a fan-out semiconductor package according to example embodiments.

Referring to FIG. 6, a package-on-package 2 includes an upper semiconductor package 40 on a fan-out semiconductor package 20.

The fan-out semiconductor package 20 may include a support wiring structure 100a, an expanded layer 1160 arranged on the support wiring structure 100a, a first semiconductor chip 1100 arranged in the expanded layer 1160, and a cover wiring structure 1200 arranged on the expanded layer 1160. The expanded layer 1160 may envelop the first semiconductor chip 1100.

A horizontal width and a horizontal area of the support wiring structure 100a of the fan-out semiconductor package 20 and a horizontal width and a horizontal area of the cover wiring structure 1200 of the fan-out semiconductor package 20 may be greater than a horizontal width and a horizontal area of a footprint formed by the first semiconductor chip 1100. In some embodiments, horizontal widths and horizontal areas of the support wiring structure 100a and the cover wiring structure 1200 may be equal to each other. In some embodiments, corresponding side surfaces of the support wiring structure 100a, the expanded layer 1160, and the cover wiring structure 1200 may be coplanar.

The support wiring structure 100a may be a redistribution layer. The support wiring structure 100a may include a support wiring insulating layer 110a and a support wiring conductive structure 120a. In some embodiments, the support wiring structure 100a may include a plurality of support wiring insulating layers 110a that are stacked. A support wiring insulating layer 110a at a lowermost end from among the plurality of support wiring insulating layers 110a may have a recess area RS. The support wiring conductive structure 120a may include a plurality of support wiring line patterns 122a and a plurality of support wiring vias 124a. A plurality of upper surface pads 132a and a plurality of lower surface pads 134a may be arranged on an upper surface and a lower surface of the support wiring structure 100a, respectively. The support wiring conductive structure 120a may electrically connect the plurality of upper surface pads 132a to the plurality of lower surface pads 134a. In some embodiments, the support wiring conductive structure 120a may electrically connect some of the plurality of upper surface pads 132a to some other ones of the plurality of upper surface pads 132a.

A plurality of UBM layers 140a may be respectively arranged on the plurality of lower surface pads 134a. Each of the UBM layers 140a may include a body portion 142a and a protrusion 144a protruding from the body portion 142a. A plurality of connection terminals 150a may be respectively attached to the plurality of UBM layers 140a. In some embodiments, the plurality of connection terminals 150a may be solder balls. The connection terminals 150a may respectively surround the protrusions 144a on the body portions 142a. A portion of the connection terminals 150a may be arranged in the recess area RS.

The first semiconductor chip 1100 may include a first semiconductor substrate 1110 having an active surface on which a first semiconductor element 1112 is formed and a plurality of first chip connection pads 1120 arranged on the active surface of the first semiconductor substrate 1110. The first semiconductor chip 1100 may be, for example, a CPU chip, a GPU chip, or an AP chip. The first semiconductor chip 1100 may be mounted on the support wiring structure 100a by using a flip chip method. For example, the first semiconductor chip 1100 may be mounted on the support wiring structure 100a such that the active surface of the first semiconductor substrate 1110 faces the support wiring structure 100a. A plurality of first chip connection terminals 1130 may be arranged between some of the plurality of upper surface pads 132a and the plurality of first chip connection pads 1120 to electrically connect the first semiconductor chip 1100 to the support wiring conductive structure 120a of the support wiring structure 100a. For example, the plurality of first chip connection terminals 1130 may be solder balls or bumps.

The expanded layer 1160 may include a plurality of connection structures 1165 and a filling member 1166 surrounding the plurality of connection structures 1165 and the first semiconductor chip 1100. The plurality of connection structures 1165 may pass through the filling member 1166 to electrically connect between the support wiring structure 100a and the cover wiring structure 1200.

In some embodiments, each of the plurality of connection structures 1165 may include a through mold via (TMV), a conductive solder, a conductive pillar, or at least one conductive bump. The filling member 1166 may include, for example, an EMC.

In other embodiments, the expanded layer 1160 may be a printed circuit board having a chip accommodating space accommodating the first semiconductor chip 1100, and the plurality of connection structures 1165 may be a circuit wiring pattern of a printed circuit board, and the filling member 1166 may be an encapsulant filling a base insulating layer and the chip accommodating space of the printed circuit board.

The cover wiring structure 1200 may include a cover wiring insulating layer 1210 and a cover wiring conductive structure 1220. The cover wiring conductive structure 1220 may include a plurality of cover wiring line patterns 1222 arranged at least on one of an upper surface and a lower surface of the cover wiring insulating layer 1210 and a plurality of cover wiring vias 1224 that pass through the cover wiring insulating layer 1210 to respectively contact and be connected to some of the plurality of cover wiring line patterns 1222.

In some embodiments, the cover wiring structure 1200 may be a redistribution layer. In other embodiments, the cover wiring structure 1200 may be a printed circuit board.

The upper semiconductor package 40 may include at least one second semiconductor chip 1300. The upper semiconductor package 40 may be electrically connected to the fan-out semiconductor package 20 via a plurality of package connection terminals 50.

The second semiconductor chip 1300 may include a second semiconductor substrate 1310 having an active surface on which a second semiconductor element 1312 is formed and a plurality of second chip connection pads 1320 arranged on the active surface of the second semiconductor substrate 1310. The at least one second semiconductor chip 1300 may be a memory semiconductor chip. The second semiconductor chip 1300 may be, for example, a DRAM chip, a static RAM (SRAM) chip, a flash memory chip, an electrically erasable programmable read-only memory (EEPROM) chip, a phase-change RAM (PRAM) chip, a magnetoresistive RAM (MRAM) chip, or a resistive RAM (RRAM) chip.

The at least one second semiconductor chip 1300 may be mounted on a package base substrate 1400 by using a flip chip method, but is not limited thereto. The package-on-package 2 may include at least one second semiconductor chip 1300, and as an upper semiconductor package, any type of semiconductor package that includes the package connection terminals 50 in a lower portion thereof to be electrically connected to the fan-out semiconductor package 20.

The package base substrate 1400 may include a package board layer 1410 and a plurality of package pads 1420 arranged on upper and lower surfaces of the package board layer 1410. The plurality of package pads 1420 may include a plurality of package upper surface pads 1422 arranged on the upper surface of the package board layer 1410 and a plurality of package lower surface pads 1424 arranged on the lower surface of the package board layer 1410. In some embodiments, the package base substrate 1400 may be a printed circuit board.

A package solder resist layer 1430 exposing the plurality of package pads 1420 may be formed on the upper surface and the lower surface of the package board layer 1410. The solder resist layer 1430 may include an upper surface solder resist layer 1432 covering the upper surface of the package board layer 1410 and exposing the plurality of package upper surface pads 1422 and a lower surface solder resist layer 1434 covering the lower surface of the package board layer 1410 and exposing the plurality of package lower surface pads 1424.

The package base substrate 1400 may include a circuit wiring 1450 electrically connecting the plurality of package upper surface pads 1422 to the plurality of package lower surface pads 1424 in the package board layer 1410.

The plurality of package upper surface pads 1422 may be electrically connected to the second semiconductor chip 1300. For example, a plurality of second chip connection terminals 1350 may be arranged between the plurality of second chip connection pads 1320 of the second semiconductor chip 1300 and the plurality of package upper surface pads 1422 of the package base substrate 1400 to electrically connect the second semiconductor chip 1300 to the package base substrate 1400. In some embodiments, an underfill layer 1380 surrounding the plurality of second chip connection terminals 1350 may be between the second semiconductor chip 1300 and the package base substrate 1400.

A molding layer 1390 surrounding the second semiconductor chip 1300 may be arranged on the package base substrate 1400. The molding layer 1390 may include, for example, an EMC.

While the inventive concept has been particularly shown and described with reference to embodiments thereof, it will be understood that various changes in form and details may be made therein without departing from the spirit and scope of the following claims.

What is claimed is:

1. A fan-out semiconductor package comprising:
   a support wiring structure comprising:
      a support wiring conductive structure;
      a plurality of support wiring insulating layers comprising a first support wiring insulating layer having a recess area and a second support wiring insulating layer on the first support wiring insulating layer, the plurality of support wiring insulating layers enveloping the support wiring conductive structure;
      a pad layer enveloped by the second support wiring insulating layer and connected to the support wiring conductive structure; and
      an under-bump metallurgy (UBM) layer enveloped by the first support wiring insulating layer and connected to the pad layer; and
   a semiconductor chip on the support wiring structure,
   wherein the UBM layer comprises a body portion and a protrusion protruding from the body portion and arranged in the recess area,
   wherein a side surface of the body portion extends from a lower surface of the pad layer provided on the first support wiring insulating layer and forms an obtuse angle with respect to the lower surface of the pad layer, and wherein a horizontal width of the protrusion is less than a horizontal width of the body portion.

2. The fan-out semiconductor package of claim 1, wherein the protrusion does not externally protrude from a lower surface of the first support wiring insulating layer and is apart from a side surface of the first support wiring insulating layer in the recess area.

3. The fan-out semiconductor package of claim 1, wherein the pad layer is integrally formed with the UBM layer comprising the body portion and the protrusion.

4. The fan-out semiconductor package of claim 1, wherein the protrusion is spaced apart from an edge of the body portion and protrudes from an inner side of the body portion.

5. The fan-out semiconductor package of claim 1, further comprising a barrier conductive layer arranged to extend from between the lower surface of the pad layer and the first support wiring insulating layer to between side surface of the body portion and the first support wiring insulating layer.

6. The fan-out semiconductor package of claim 5, wherein the barrier conductive layer does not cover a surface of the protrusion.

7. The fan-out semiconductor package of claim 6, wherein a lower surface of the protrusion is located in the recess area at a depth having an equal value to a thickness of the barrier conductive layer in a vertical direction, from a lower surface of the first support wiring insulating layer.

8. The fan-out semiconductor package of claim 1, wherein the body portion has a tapered shape in which a horizontal width thereof narrows away from the pad layer.

9. The fan-out semiconductor package of claim 1, wherein the protrusion has a tapered shape in which a horizontal width thereof is increased away from the body portion.

10. The fan-out semiconductor package of claim 1, wherein the pad layer has an upper surface having a concave shape.

11. A fan-out semiconductor package comprising:
    a support wiring structure comprising:
       a support wiring conductive structure;
       a plurality of support wiring insulating layers comprising a first support wiring insulating layer having a recess area and a second support wiring insulating layer on the first support wiring insulating layer, the plurality of support wiring insulating layers enveloping the support wiring conductive structure;
       a pad layer enveloped by the second support wiring insulating layer and connected to the support wiring conductive structure;
       an under-bump metallurgy (UBM) layer comprising a body portion enveloped by the first support wiring insulating layer and connected to the pad layer and at least one protrusion protruding from the body portion and not externally protruding from a lower surface of the first support wiring insulating layer in the recess area and arranged apart from the first support wiring insulating layer and surrounded by a connection terminal arranged on the body portion, wherein the UBM layer is integrally formed with the pad layer; and
       a barrier conductive layer arranged to extend from between a lower surface of the pad layer and the first support wiring insulating layer to between a side surface of the body portion and the first support wiring insulating layer; and
    a semiconductor chip arranged on the support wiring structure and having a horizontal width and a horizontal area that are less than a horizontal width and a horizontal area of the support wiring structure, wherein the side surface of the body portion extends from the lower surface of the pad layer provided on the first support wiring insulating layer and forms an obtuse angle with respect to the lower surface of the pad layer, and wherein a horizontal width of the at least on protrusion is less than a horizontal width of the body portion.

12. The fan-out semiconductor package of claim 11, wherein the at least one protrusion is spaced apart from an edge of the body portion by a distance of about 5 μm to about 30 μm.

13. The fan-out semiconductor package of claim 11, wherein the horizontal width of the at least one protrusion is equal to or greater than 20 μm.

14. The fan-out semiconductor package of claim 11, wherein the UBM layer comprises the body portion and the at least one protrusion having a horizontal shape of a circle, an oval, a quadrangle, a polygon, a ring, or a mesh.

15. The fan-out semiconductor package of claim 11, wherein the UBM layer comprises the body portion and a plurality of the protrusions, wherein at least one of the plurality of the protrusions has a horizontal ring shape or horizontal bar shape.

16. The fan-out semiconductor package of claim 11, wherein a lower surface of the at least one protrusion is at a substantially identical vertical level to the lower surface of the first support wiring insulating layer or in a recess area at a depth of 0.5 μm or less from the lower surface of the first support wiring insulating layer.

17. The fan-out semiconductor package of claim 11,
wherein the at least one protrusion has a first height of about 10 μm to about 30 μm in a vertical direction, and
wherein the body portion has a second height that is less than the first height of the at least one protrusion in the vertical direction.

18. A fan-out semiconductor package comprising:
a redistribution interposer comprising:
a support wiring conductive structure;
a plurality of support wiring insulating layers comprising a first support wiring insulating layer having a recess area and a second support wiring insulating layer on the first support wiring insulating layer, the plurality of support wiring insulating layers enveloping the support wiring conductive structure;
a pad layer enveloped by the second support wiring insulating layer and connected to the support wiring conductive structure;
an under-bump metallurgy (UBM) layer comprising a body portion enveloped by the first support wiring insulating layer and connected to the pad layer and at least one protrusion protruding from the body portion and not externally protruding from a lower surface of the first support wiring insulating layer in the recess area and arranged apart from the first support wiring insulating layer, wherein the UBM layer is integrally formed with the pad layer; and
a barrier conductive layer extending from between a lower surface of the pad layer and the first support wiring insulating layer to between a side surface of the body portion and the first support wiring insulating layer and arranged not to cover a surface of the at least one protrusion;
a first semiconductor chip and a second semiconductor chip that are apart from each other on the redistribution interposer in a horizontal direction to be electrically connected to the support wiring conductive structure, wherein the first semiconductor chip comprises a first sub-semiconductor chip and a plurality of second sub-semiconductor chips that are stacked in a vertical direction;
a molding layer surrounding the first semiconductor chip and the second semiconductor chip on the redistribution interposer;
a connection terminal surrounding the at least one protrusion on the body portion of the UBM layer and having a portion arranged in the recess area; and
a main board on which the redistribution interposer is mounted to be connected to the connection terminal,
wherein the side surface of the body portion extends from the lower surface of the pad layer provided on the first support wiring insulating layer and forms an obtuse angle with respect to the lower surface of the pad layer, and
wherein a horizontal width of the at least one protrusion is less than a horizontal width of the body portion.

19. The fan-out semiconductor package of claim 18, wherein, in the horizontal direction, a width of the body portion is less than a width of the pad layer and the horizontal width of the at least one protrusion is equal to or greater than 20 μm, and
wherein a depth of the recess area in the vertical direction is between about 10 μm to about 30 μm.

20. The fan-out semiconductor package of claim 18, wherein the body portion has a tapered shape in which a horizontal width thereof narrows away from the pad layer, and
wherein the at least one protrusion has a height that is greater than a height of the body portion and has a tapered shape in which a horizontal width thereof is increased away from the body portion.

* * * * *